(12) United States Patent
Patel et al.

(10) Patent No.: US 6,414,518 B1
(45) Date of Patent: Jul. 2, 2002

(54) CIRCUITRY FOR A LOW INTERNAL VOLTAGE INTEGRATED CIRCUIT

(75) Inventors: Rakesh H. Patel, Cupertino; John E. Turner, Santa Cruz; John D. Lam, Fremont; Wilson Wong, San Francisco, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/449,166

(22) Filed: Nov. 24, 1999

Related U.S. Application Data

(63) Continuation of application No. 08/863,876, filed on May 27, 1999, now Pat. No. 6,025,737.
(60) Provisional application No. 60/018,465, filed on May 28, 1996, provisional application No. 60/018,494, filed on May 28, 1996, provisional application No. 60/018,510, filed on May 28, 1996, provisional application No. 60/022,837, filed on Jul. 31, 1996, provisional application No. 60/031,617, filed on Nov. 27, 1996, and provisional application No. 60/046,810, filed on May 2, 1997.

(51) Int. Cl.⁷ .............................................. H03K 19/00
(52) U.S. Cl. .......................... 326/101; 326/41; 257/207
(58) Field of Search ............................. 326/47, 41, 39, 326/38, 101–103; 257/207, 203, 204, 208, 401, 211, 368

(56) References Cited

U.S. PATENT DOCUMENTS

| | | | | | |
|---|---|---|---|---|---|
| 4,572,972 A | * | 2/1986 | Shoji | ........................... | 327/566 |
| 5,347,150 A | * | 9/1994 | Sakai et al. | .................. | 257/203 |
| 5,485,026 A | * | 1/1996 | Hanibuchi | ................... | 257/203 |
| 5,814,845 A | * | 9/1998 | Carley | ......................... | 257/207 |

* cited by examiner

*Primary Examiner*—Michael Tokar
*Assistant Examiner*—James H. Cho
(74) *Attorney, Agent, or Firm*—Townsend and Townsend and Crew LLP

(57) ABSTRACT

A technique provides an on-chip voltage to a core portion of an integrated circuit by way of a conversion transistor. The on-chip voltage may be a reduced internal voltage, less than the VCC of the integrated circuit. In an embodiment, the layout (or physical structure) of the conversion transistor is distributed surrounding the core portion. By providing the core with a reduced voltage, the integrated circuit may interface with other integrated circuits compatible with different voltage levels.

34 Claims, 31 Drawing Sheets

* Thick oxide device

*May be thick oxide device

*May be thick oxide device or devices

CIRCUITRY FOR A LOW INTERNAL VOLTAGE INTEGRATED CIRCUIT

This application is a continuation U.S. patent application Ser. No. 08/863,876, filed May 27, 1999, now U.S. Pat. No. 6,025,737, which claims priority to U.S. provisional application No. 60/018,465, filed May 28, 1996; No. 60/018,494, filed May 28, 1996; No. 60/018,510, filed May 28, 1996; No. 60/022,837, filed Jul. 31, 1996; No. 60/031,617, filed Nov. 27, 1996; and No. 60/046,810, filed May 2, 1997. All references cited above and in this application are incorporated by reference in their entirety for all purposes.

BACKGROUND OF THE INVENTION

The present invention relates to the field of integrated circuits, and more specifically, to improving the interfacing of integrated circuit in a mixed-voltage environment.

The integrated circuit business and semiconductor industry are continually driven to reduce cost, reduce power, and improve performance. The integrated circuit products include microprocessors, memories, programmable logic, programmable controllers, application specific integrated circuits, and many other types of integrated circuits. Price reduction is strongly driven by migrating products to scaled processes, which reduce die sizes and increase yields. Power reduction has been achieved by circuit design techniques, power management schemes, and parasitic scaling, among other factors. Performance improvement has resulted from design techniques, process enhancements, and parasitic scaling, among other factors.

Process technology is improving. Resulting from the continual scaling and shrinking of device geometries, device sizes and dimensions require the operating voltages to be scaled. Operating voltages have been scaled down from 5 volts to 3.3 volts. This has resulted in the need for mixed-voltage-mode systems. That is, integrated circuits will need to interface with various operating voltages. And, further reductions are expected in the future. This industry provides products and printed circuit boards (PCBs) that utilize both 3.3-volt and 5-volt integrated circuits and devices. It is expected that there may be a considerable transition period for the standard power supply to switch from one voltage level to a lower voltage level.

Process scaling is the dominant method of reducing the die cost. The cost is achieved by receiving higher yields associated with smaller die sizes. Presently, power supply voltages are being reduced as the scaling progresses towards device dimensions that necessitate the reduction of voltage differences across these dimensions.

All manufacturers have not switched over to the lower power supply, simultaneously. Thus the scaling of the operating voltage has resulted in creating a multiple voltage mode industry. Integrated circuit companies must provide products capable of addressing the needs during this intermediate phase before the industry transitions to a single lower power supply voltage. It is expected that this industry will require some time to successfully transition over to the lower power supply.

As can be seen, an improved technique of fabricating, and operating integrated circuits is needed to meet these demands. These integrated circuits should interact with devices that are designed to operate at either the standard or the new lower power supply. The integrated circuit should also provide a cost reduction path to customers that continue to design 5-volt-only systems. Integrated circuits should provide the manufacturer with the flexibility to chose the market to support with a minimum cost and the shortest time to market.

SUMMARY OF THE INVENTION

The present invention is a technique of interfacing an integrated circuit in a mixed-voltage mode environment. In particular, the integrated circuit is fabricated using technology compatible with an internal supply voltage. Externally, the integrated circuit will interface with an external supply voltage, above the internal supply voltage. The input and output signals to and from the integrated circuit will be compatible with the external supply level.

An integrated circuit of the present invention will include conversion circuit for converting a voltage at a level of external supply voltage to a level of the internal supply voltage. In one embodiment, the conversion circuitry uses negative feedback, and is self-regulating. This internal supply voltage will be used to power the internal devices on the integrated circuit. The integrated circuit will contain conversion circuitry to convert output signals to be compatible with the external supply voltage. Also, the integrated circuit will also be able to accept input voltages compatible with the external supply voltage. The integrated circuit will appear to a user and other integrated circuits as though it were manufactured using technology compatible with the external supply voltage. The present invention is a useful technique for providing backward compatibility of a process technology.

The present invention may be used in an integrated circuit having separated noisy and quiet supplies. For example, the I/O drivers may be coupled to a noisy supply while the conversion circuit is coupled to the quiet supply. This will help noise from the I/O drivers from coupling into the core of the integrated circuit.

A layout of the conversion circuitry is compact and also spreads current flow and heat distribution evenly around the integrated circuit. This helps prevent the formation of localized "hot spot" areas.

More specifically, an integrated circuit of the present invention includes an output driver coupled to a first voltage supply; a level shifter circuit coupled to a second voltage supply; and a voltage down converter circuit, coupled to the second voltage supply. The voltage down converter generates a first voltage supply having a voltage level below the second voltage supply. Circuitry in a core of the integrated circuit is coupled to the first voltage supply.

Other objects, features, and advantages of the present invention will become apparent upon consideration of the following detailed description and the accompanying drawings, in which like reference designations represent like features throughout the figures.

DESCRIPTION OF THE SPECIFIC EMBODIMENTS

Figure 1:
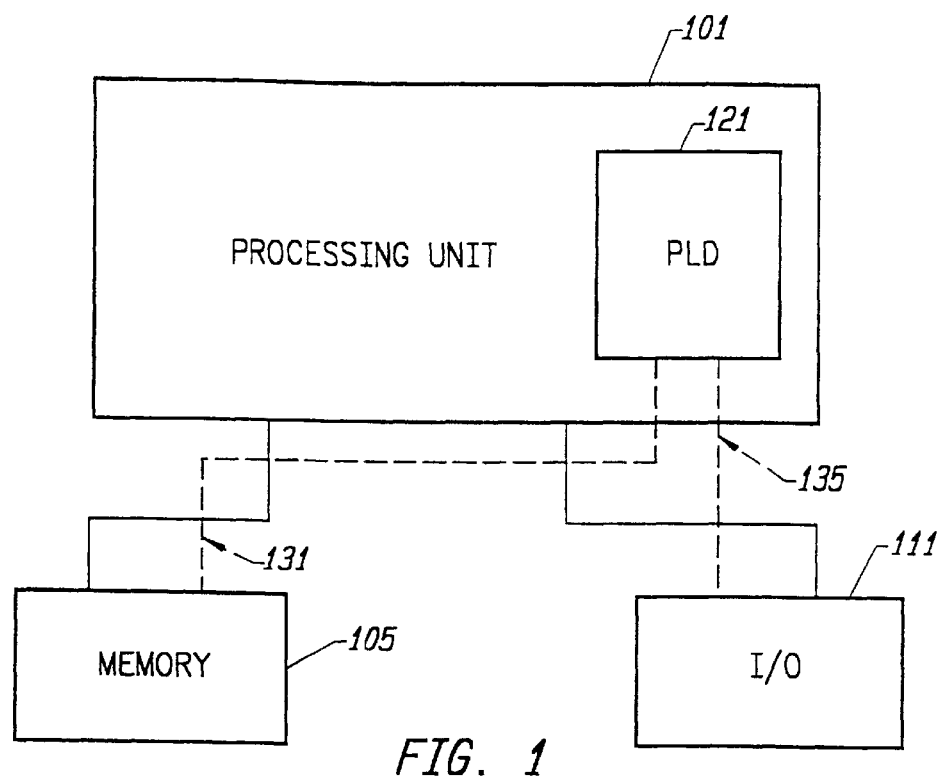
FIG. 1 is a block diagram of a digital system incorporating a programmable logic device integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices (sometimes referred to as a PALs, PLAs, FPLAs, PLDs, EPLDs, EEPLDs, LCAs, or FPGAs), are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241,224 and 4,871,930, and the Altera Data Book, June 1996, all incorporated herein by reference. The latter are described in, for example, U.S. Pat. Nos. 5,258,668, 5,260, 610, 5,260,611, and 5,436,575, and the Altera Data Book, June 1996, all incorporated herein by reference for all purposes. Logic devices and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (PAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
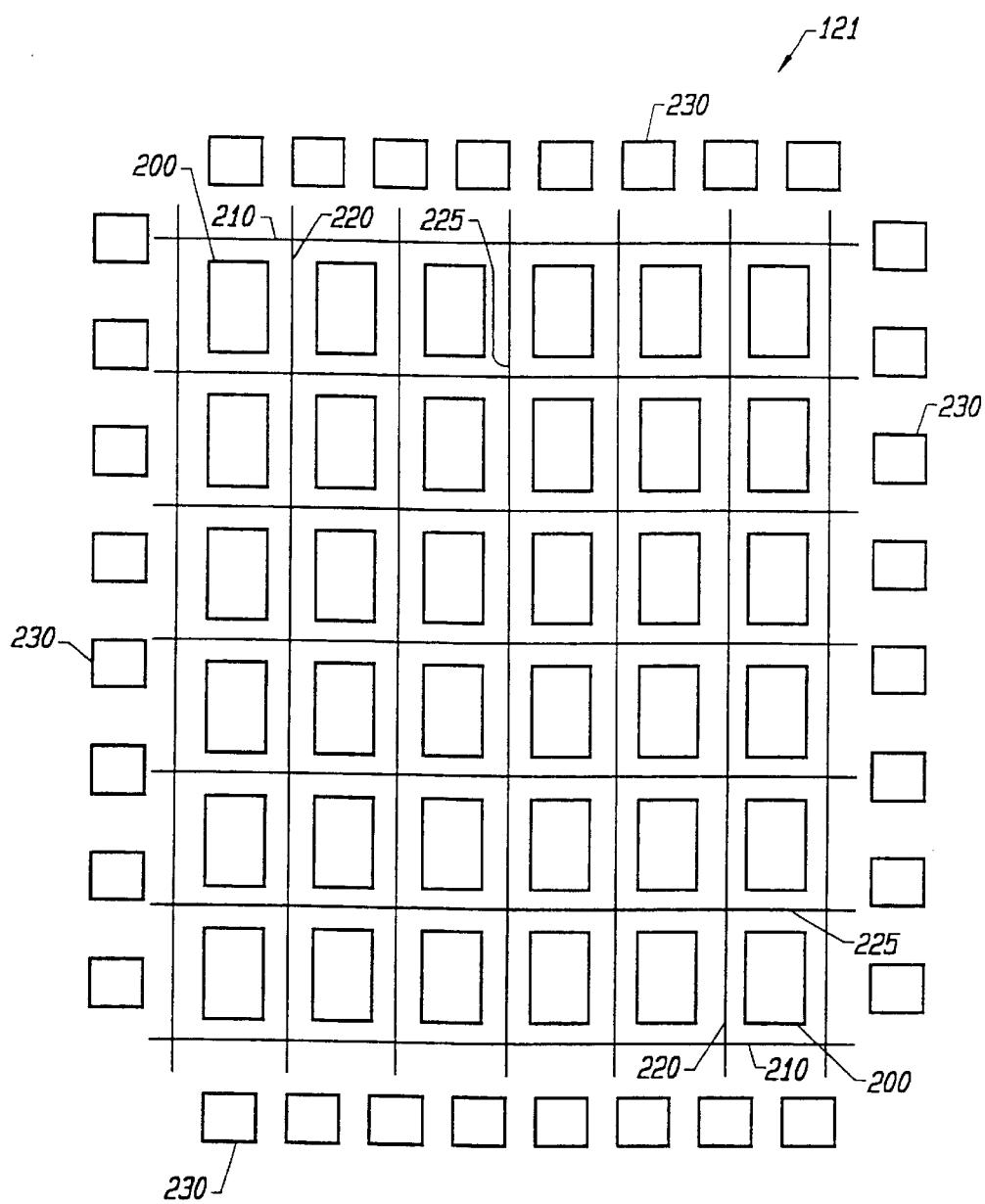
FIG. 2 is a block diagram showing an architecture for a programmable logic device.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
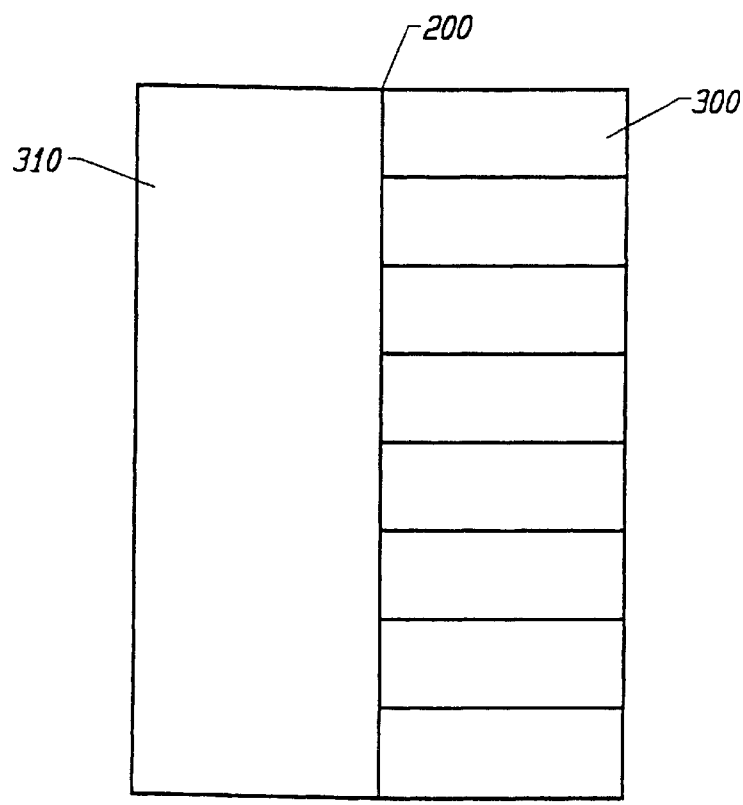
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 4:
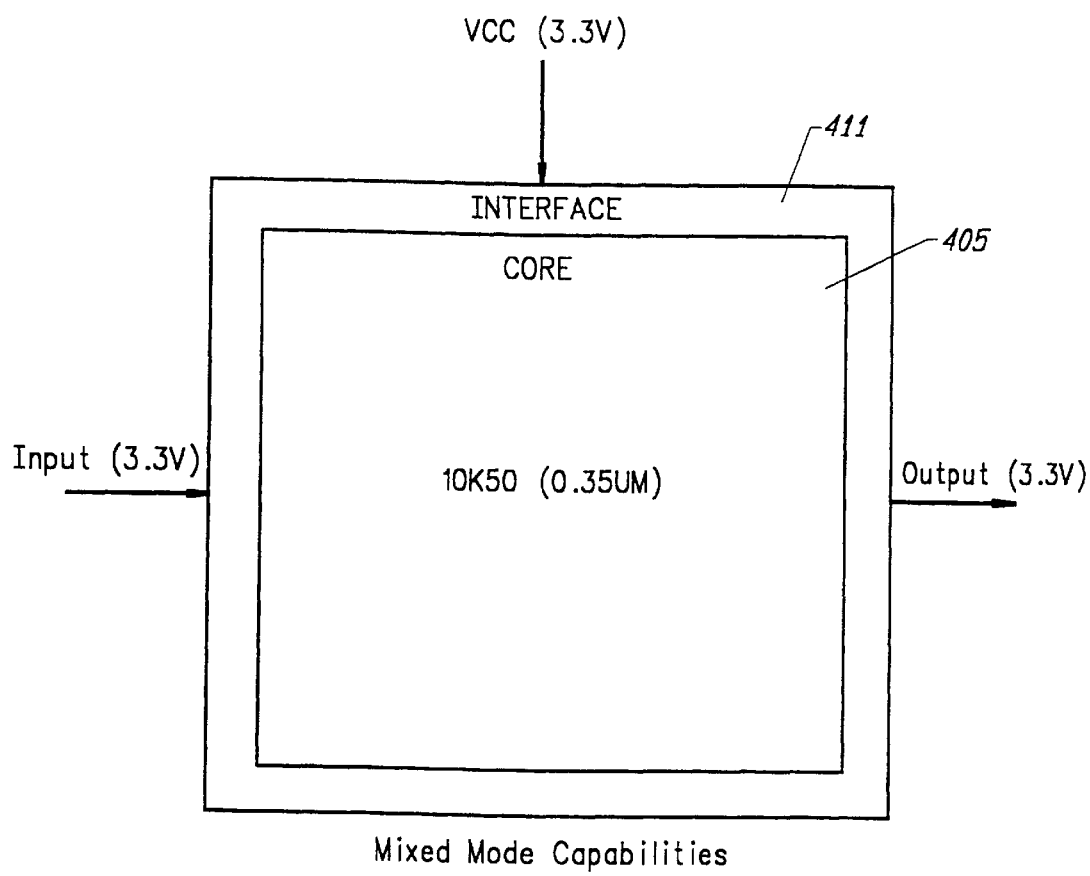
FIG. 4 shows an option for an integrated circuit of the present invention providing a single voltage supply solution.
Figure 5:
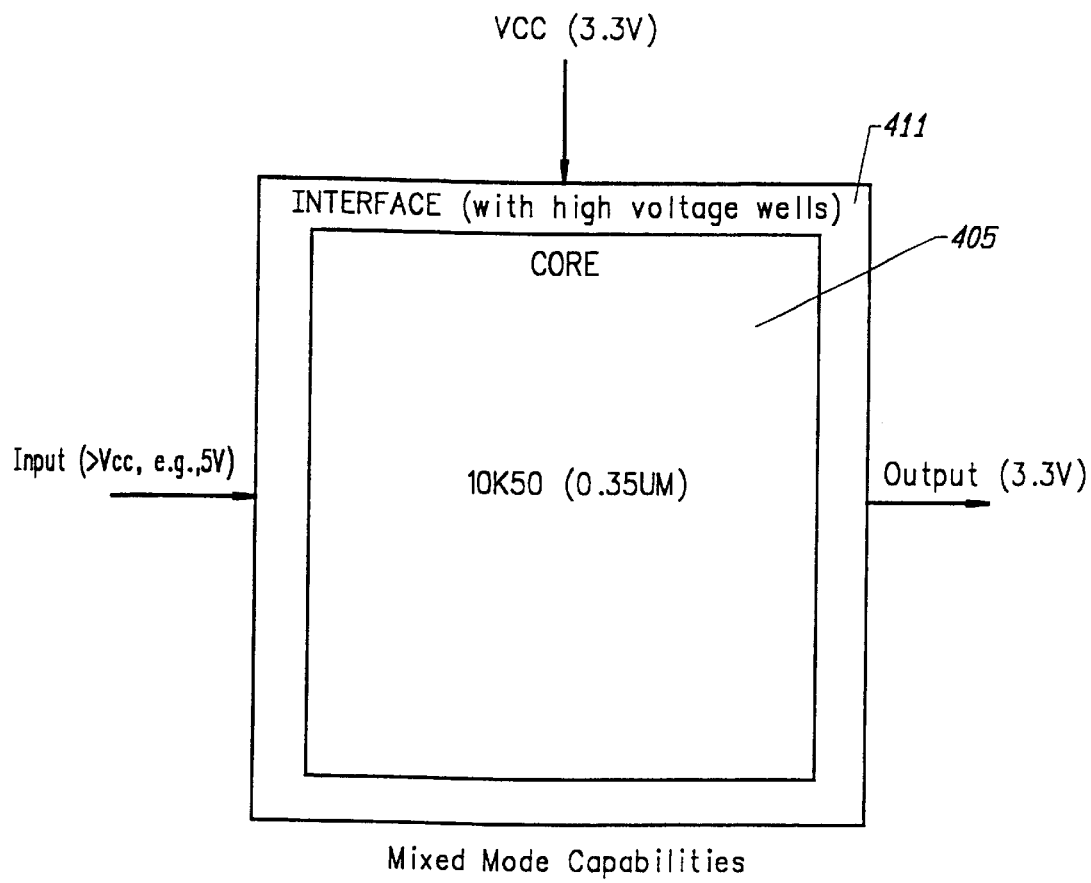
FIG. 5 shows an option for an integrated circuit of the present invention providing the capability to tolerate and interface in a mixed voltage environment.
Figure 6:
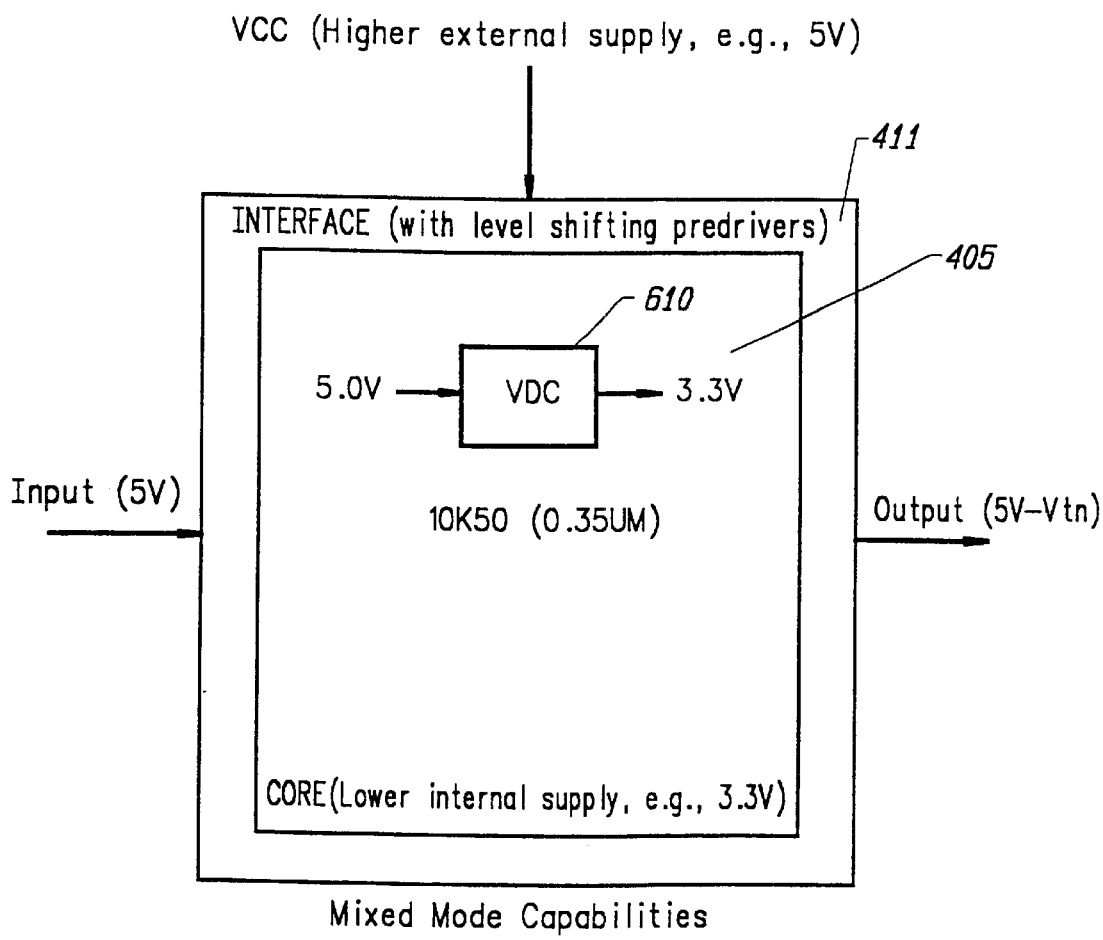
FIG. 6 shows an option for an integrated circuit of the present invention providing the ability to interface with a supply voltage above that for a core of the integrated circuit.

FIGS. 4–6 illustrate a technique of interfacing integrated circuits including programmable logic devices and field programmable gate arrays to other integrated circuits. With improvements in process technology, integrated circuits use lower power supply voltages such as 3.3 volts or 2.5 volts, or even lower. However, integrated circuits made with these processes should remain compatible with previous generation integrated circuits. For example, a 3.3-volt integrated circuit may need to be used on a printed circuit board with 5-volt integrated circuits. The 3.3-volt integrated circuit will need to have the proper supply and input voltages for operation. Also, the 3.3-volt integrated circuit should supply or generate the proper output voltages for interfacing with the other integrated circuits. Proper interfacing of the integrated circuits is essential for proper functional operation. Further, proper interfacing will prevent undesirable conditions, such as overstressing the devices, avoiding possible high current or latch-up conditions, and other similar concerns. This will improve device longevity.

Using a technique of the present invention, integrated circuits such as programmable logic devices and field programmable gate arrays may be fabricated with mixed-mode capability. Such an integrated circuit will be capable of being configured to interface with a variety of integrated circuits operating at similar and different voltage levels. By selecting and programming the appropriate programmable options, the integrated circuit will be able to interface with integrated circuits using the same supply voltage, lower supply voltage, and higher supply voltage.

In a preferred embodiment, the programmable options are implemented by way of metal options selected during processing by selecting and using the appropriate masks. For example, a mixed mode integrated circuit manufactured using 3.3-volt technology may have three options.

In a first option (illustrated by FIG. 4), the integrated circuit is compatible with 3.3-volt technology. Specifically, input signals from other integrated circuits should be 3.3-volt compatible. The power supply will be 3.3 volts. And the output signal will provide 3.3-volt drive capability.

More specifically, as shown in FIG. 4, a core 405 and an interface 411 of the integrated circuit will operate with a 3.3-volt supply. Further, interface 411 will be compatible with input signals from 3.3-volt circuits, and will generate output signals for interfacing with 3.3-volt circuits. For a programmable integrated circuit such as a PLD or FPGA, core 405 may include the LABs, LEs, programmable interconnect including GVs, GHs, and local interconnect. In contrast, interface 411 would include dedicated input buffers, dedicated output buffers, output drivers, input-output buffers, and associated circuitry.

In a second option (illustrated in FIG. 5), the integrated circuit is capable of tolerating 5-volt input signals. The power supply will be 3.3 volts. And the output signal will provide 3.3-volt drive capability. In this case, as shown in FIG. 5, the supply voltage for core 405 and interface 411 will be 3.3 volts. Interface 411 will be tolerant to voltages from 5-volt integrated circuits. Interface 411 will generate 3.3-volt compatible output.

In a third option (illustrated in FIG. 6), the integrated circuit will tolerate 5-volt input signals. The power supply will be 5 volts. And the output signal will provide 5-volt compatible drive capability. As an example, the voltage level for a logic high at the output will be about 5 volts—VTN or above. Please note, even in this case, the integrated circuit will be manufactured using 3.3-volt technology. As shown in FIG. 6, the power supply is 5 volts. This voltage is converted using on-chip circuitry to a lower voltage of 3.3 volts. This conversion may be performed using a voltage down converter (VDC) 610. The lower voltage is supplied to the circuitry in core 405 and interface 411. Interface 411 is capable of tolerating 5-volt input signals. Further, in interface 411, the core 3.3-volt signals may be converted to 5-volt output signals by circuitry such as level-shifting predrivers. The circuits used to perform the conversion in the interface are connected to the 5-volt supply voltage.

Using the technique of the present invention, there may be more or less than three options. An integrated circuit may have, for example, any combination of two of the modes described above. Further, there may be additional options, other than those described above. As an example, there may be low power version and high power version of a chip, where this is selectable via programmable options. Specific implementations of some of the above options are discussed in further detail below.

In the present invention, the circuitry for implementing the three options resides on the integrated circuit. Specifically, in the above case of three options, the circuitry necessary for the first option, second option, and third option are on-chip. Then, by appropriately connecting the appropriate circuitry by programmable options (e.g., programmable links, programmable cells, metal mask options), a mode or design is selected for that integrated circuit chip. Moreover, using this technique, circuitry on the integrated circuit is shared among the multiple options so that silicon area is conserved. For example, in a programmable logic device, a 5-volt tolerant or 3.3-volt specific input/output (I/O) interface may be programmably selected to be connected to programmable logic core. This programmable logic core would include the LABs and LEs and programmable interconnect.

There are many techniques for implementing the programmable options feature of the present invention besides mask programmable options. These include, and are not limited to, laser programmable options, fuses, antifuse, in-system programmable (ISP) options, reprogrammable cells such as EEPROM, Flash, EPROM, and SRAM, and many others.

The voltage levels given above are merely for the purpose of example. The present invention may be easily applied to any mixed voltage level situation involving at least two different voltage levels. For example, one of the voltage levels may be 3.3 volts while another voltage level is 2.5 volts.

Furthermore, the internal circuitry (e.g., core 405) will be compatible with a VCCint voltage. There may be separated external supply pins to the integrated circuit. For example, there may be a noisy supply, VCCN and a quiet supply VCCQ. These will be discussed further below.

For example, for a 2.5-volt technology core, when VCCQ is 2.5 volts and VCCN is 2.5 volts, the first option is selected for an integrated circuit that will be tolerant to 2.5-volt external signals. When VCCQ is 2.5 volts and VCCN is 2.5 volts, the second option is selected for an integrated circuit that will be tolerant to 3.3-volt external signals, or signals above 3.3 volts. The degree of tolerance to external signals of 3.3 volts or above may be dependent on numerous factors including the process technology used, thickness of the oxide for the devices and transistors, and many other considerations. When VCCQ is 3.3 volts and VCCN is 3.3 volts or less, the third option is selected, and the integrated circuit will be tolerant to external signals up to VCCN. When VCCQ is 2.5 volts and VCCN is less than 2.5 volts, the first or second option may be selected. An integrated circuit with the first option will be tolerant to external signals up to VCCN. An integrated circuit with the second option will be tolerant to external signals up to 3.3 volts or above, depending on process technology considerations such as oxide thickness and others.

Similarly, for a 3.3-volt technology core, when VCCQ is 3.3 volts and VCCN is 3.3 volts, the first option is selected for an integrated circuit that will be tolerant to 3.3-volt external signals. When VCCQ is 3.3 volts and VCCN is 3.3 volts, the second option is selected for an integrated circuit that will be tolerant to 5-volt external signals. When VCCQ is 5 volts and VCCN is 5 volts or less, the third option is selected, and the integrated circuit will be tolerant to external signals up to VCCN. When VCCQ is 3.3 volts and VCCN is less than 3.3 volts, the first or second option may be selected. An integrated circuit with the first option will be tolerant to external signals up to VCCN. An integrated circuit with the second option will be tolerant to the external signals to 3.3 volts or above, depending on process technology considerations such as oxide thickness and others.

For a 5-volt technology core, when VCCQ is 5 volts and VCCN is 5 volts, the first option is selected for an integrated circuit that will be tolerant to 5-volt external signals. When VCCQ is 5 volts and VCCN is less than 5 volts, the first or second option may be selected. An integrated circuit with the first option will be tolerant to external signals up to VCCN. An integrated circuit with the second option will be tolerant to external signals up to 5 volts.

Figure 7:
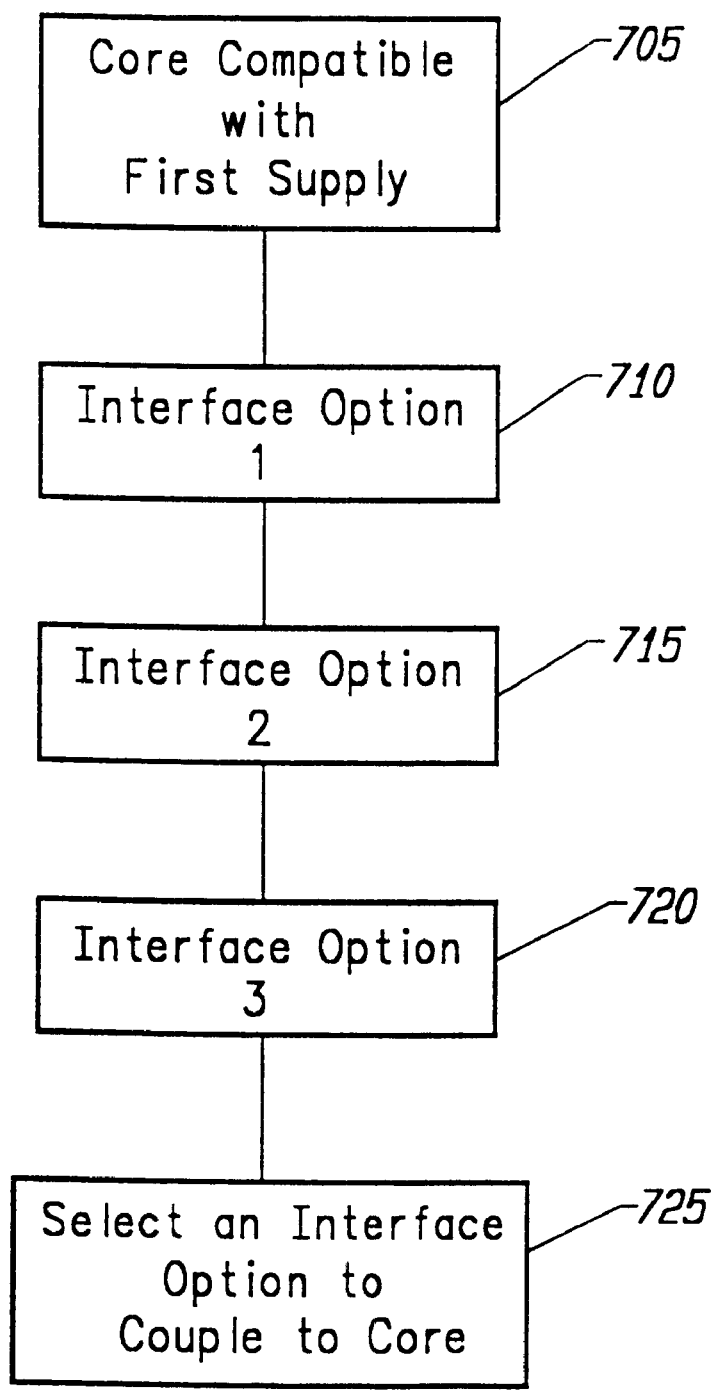
FIG. 7 is a flow diagram illustrating a technique of fabricating an integrated circuit capable of interfacing in a mixed voltage environment.

Integrated circuits may be fabricated according to the technique as shown in FIG. 7. A step 705 provides an integrated circuit core compatible with an internal supply voltage. For example, this internal supply voltage may be 3.3 volts. The integrated circuit core may include the programmable logic (e.g., LABs, LEs, look-up tables, macrocells, product terms) in a PLD or FPGA.

A step 710 provides a first interface option (e.g., see FIG. 4), which may provide an interface for the integrated circuit designed to handle input signals from external circuits compatible with the internal voltage supply level (e.g., 5 volts) and generate output signals for external circuits compatible with the internal supply voltage level. For example, using this first interface option, a 3.3-volt only integrated circuit may be manufactured. This corresponds to an integrated circuit as shown in FIG. 4.

A step 715 provides a second interface (e.g., see FIG. 5), which may provide an interface for the integrated circuit designed to handle input signals from external circuits compatible with another external supply voltage level (e.g., 5 volts) and generate output signals for external circuits compatible with the internal supply voltage level (e.g., 3.3 volts). For example, using the second interface option, a 3.3-volt integrated circuit that is tolerant of 5-volt input signals may be manufactured. This corresponds to an integrated circuit as shown in FIG. 5

A step 720 provides a third interface (e.g., see FIG. 6), which may provide an interface for the integrated circuit designed to handle input signals from external circuits compatible with the external supply voltage level (e.g., 5 volts) and generate output signals for external circuits compatible with the external supply voltage level (e.g., 5 volts). For example, using the third interface option, a 5-volt external integrated circuit may be manufactured using 3.3-volt process and device technology. The internal circuitry will operate at 3.3 volts. This corresponds to the integrated circuit as shown in FIG. 6. The second supply voltage may be generated on-chip.

In a preferred embodiment, the circuitry to implement these three interface options are formed on the same integrated circuit or semiconductor body as the core.

A step 725 involves selectively coupling the first interface, second interface, or third interface to the core. Step 725 may be performed by selectively programming the integrated circuit, such as by metal masking, e-beam lithography, programming laser fuses, programmable fuses, antifuse, electrically erasable programmable cells, and many others. The selected interface option will be programmably interconnected with the core. Circuitry to implement the options may be resident on the integrated circuit; however, the circuitry is not needed to perform a particular interface option will be disabled. Furthermore, the same circuitry may be "reused" in multiple interface options. This will aid in providing an even more compact layout.

Using the technique of the present invention, an integrated circuit may be easily manufactured to be compatible with different operating environments, without specifically designing an individual integrated circuit for each specific case. This leads to reduced research and development and production costs. This also reduces the risk of holding an excess inventory in unneeded integrated circuit types. In particular, integrated circuits where an interface option has not yet been selected, may be selectively fabricated or programmed with the appropriate interface option as needed. This allows a much faster response time for fabricating the desired integrated circuits to meet rapidly changing market conditions.

Figure 8:
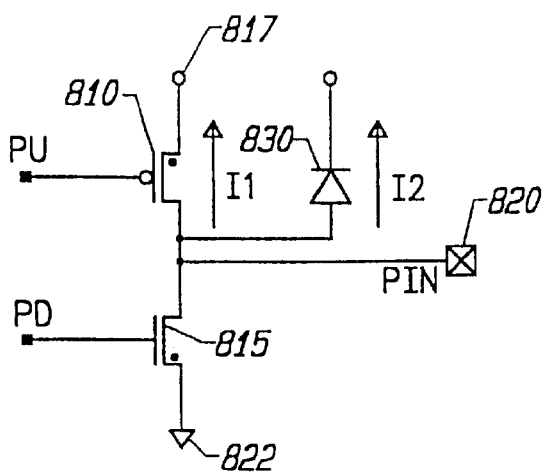
FIG. 8 shows a circuit diagram of an output driver.

FIG. 8 shows an output driver which may be used in interface 411 of the integrated circuit. Such an output driver may be used in one of the interface options of the integrated circuit. In particular, this circuitry may be used in the implementation of the first option shown in FIG. 4. The output driver includes a pull-up driver 810 and a pull-down driver 815. In this embodiment, pull-up driver 810 is a PMOS transistor and pull-down driver 815 is an NMOS transistor. Pull-up driver 810 is coupled between a supply 817 and a pin (or pad) 820. Pin 820 may sometimes be referred as an I/O pad as it may be used for input or output, or both. Pull-down driver 815 is coupled between pin 820 and a supply 822. Supply 817 is typically VDD or VCC and supply 822 is typically VSS.

In operation, the output driver will generate a logic high, logic low, or be tristated (i.e., high impedance state;) depending on the logic signals at PU and PD. PU is coupled to a gate of pull-up driver 810 and PD is coupled to a gate of pull-down driver 815. When PU is a low and PD is a low, the pin will be driven high (to the level of VCC). When PU is high and PD is high, the pin will be driven low (to the level of VSS). When PU is high and PD is low, the pin will be tristated. Pin 820 is typically coupled to an input buffer (not shown) for the inputting of logical signals into the integrated circuit and the core. Pin 820 may be used as an input when the output buffer is placed in tristate, or may also be used to feed back signals from the output buffer into the integrated circuit.

However, the output driver circuit shown in FIG. 8 is not tolerant to high voltages, and would not be useful in the case where input voltages are from an integrated circuit having a supply voltage above a level of first supply 817. For example, when the output buffer is tristated, signals are input to the input buffer (not shown) via pin 820. If first. supply 817 is 3.3 volts, then when interfacing a 5-volt integrated circuit, pin 820 may potentially be 5 volts or above. A 5-volt input would represent a logic high input. This voltage may even go above 5 volts during transitions due to glitches and switching noise. This poses potential problems.

An I1 current sneak path (or leakage path) will occur when the VPIN (the voltage level at the pin) goes above 3.3 volts+|VTP|. VTP is the threshold voltage of pull-up driver 810. Furthermore, in an embodiment, pull-up driver 810 is a PMOS transistor and formed in an n-well on a p-type substrate. In that case, there is a parasitic diode 830 between pin 820 and first supply 817. Parasitic diode 830 represents the diode between the p-diffusion used to form the drain and the n-well region, which is connected to first supply 817. Therefore, an I2 current sneak path will also occur when the VPIN goes above 3.3 volts+Vdiode. Vdiode is the turn-on or forward voltage (VF) of the diode.

Sneak current paths I1 and I2 will allow the first supply (VCC) to rise. If VCC rises greater than absolute maximum allowable levels and remain at those levels for a longer than acceptable time, the device will have oxide reliability issues. Therefore, it is undesirable for the output buffer shown in FIG. 8 to interface with voltage levels above first supply 817.

Figure 9A:
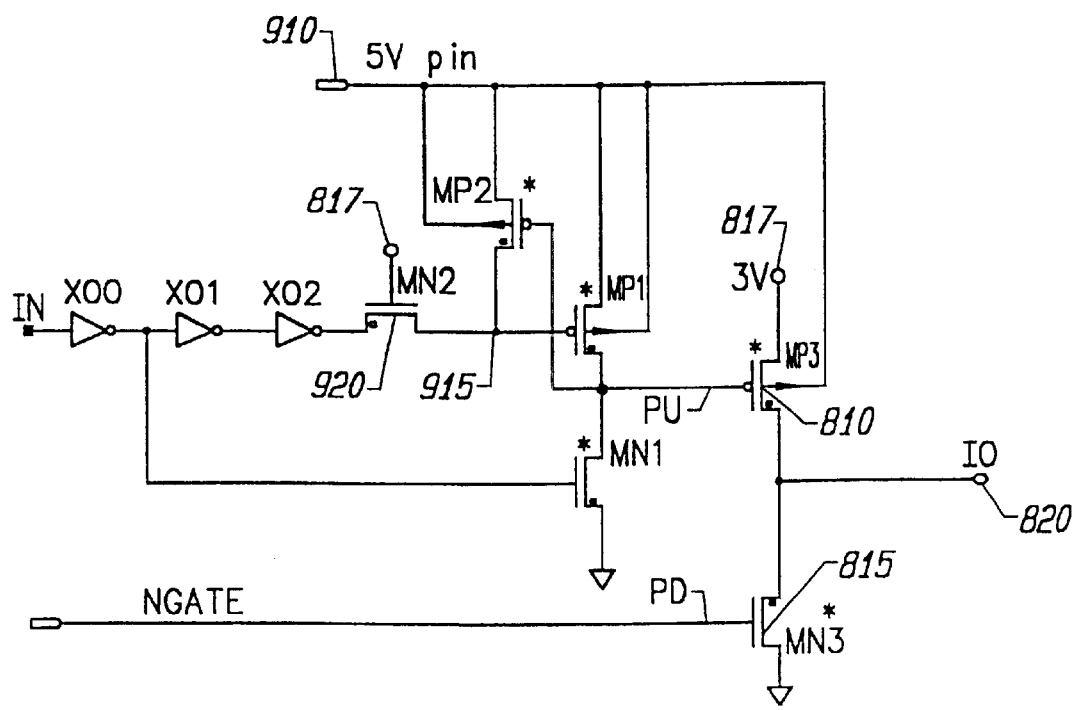
FIG. 9A shows a circuit diagram of an output driver, tolerant of high voltage at an I/O pad, which has dual power supply pins.

FIG. 9A shows an output driver circuit which is tolerant to high-voltage inputs at pin 820. This circuitry may be used for the second interface option described above and shown in FIG. 5. In FIG. 9A, the output driver has a separate 5-volt supply pin 910 and 3.3-volt supply pin 817. When a separate supply pin is not available or desirable, this 5-volt supply voltage may be internally generated by a voltage pump or other similar means. For example, an internal voltage of 5 volts may be generated from the 3.3-volt supply. The n-well for pull-up driver 810 (a PMOS transistor) is connected to node 910. This n-well (which will be at 5 volts) will prevent the I2 current path discussed above.

Furthermore, circuitry is coupled to PU to prevent the I1 current path. The circuitry used to bias node PU includes PMOS transistors MP1 and MP2 and NMOS transistor MN1. MP1 is coupled between supply 910 and PU and MN1 is between PU and VSS. MP2 is between supply 910 and a gate of MP1 (node 915). Body connections for MP1 and MP2 are coupled to supply 910. A chain of inverters X00, X01, and X02 feed through an NMOS passgate transistor 920 into the gate of MP1. A gate of MN1 is coupled to an output of inverter X00. An input node In inputs inverter X00.

When an input node IN is low, PU will be low since MN1 is on and MP1 is off. In this case, the sneak current paths are not a concern since pull-up driver 810 will be on. In the case when IN is high, PU will be at the level of supply 910 (e.g., 5 volts). When PU is 5 volts, I1 will not conduct unless VPIN is 5 volts+|VTP|. Therefore, there will be no I1 path when pin 820 is at 5 volts. PU is 5 volts because node 915 is low and supply 910 (5 volts) is passed through MP1 to PU. The n-wells of MP1 and MP2 are connected to supply 910 in order to prevent problems such as latch-up and to minimize the body effect. The n-well of MP3 may also be coupled to supply 910 for this purpose.

Pass transistor 920 also serves to isolate inverter X02 from node 915. Even when the node 915 is above the voltage of supply 817 (e.g., 3.3 volts), pass transistor 920 (MN2) will limit the voltage at an output of inverter X02 to the voltage level of supply voltage 817 less a VTN (i.e., threshold voltage of pass transistor 920). This will prevent unduly overstressing the devices used to form inverter X02.

In a preferred embodiment, MN3, MN1, MP1, MP2, and MP3 are thick oxide devices. MN2 may also be a thick oxide device, which would ensure reliability under the condition when supply 817 is off and nodes 910 and 915 are at 5 volts. Thick oxide devices are transistors which have thicker gate oxide than the thin gate oxide used for other transistors. For example, a thin oxide device may have an oxide thickness of about 70 Angstroms. A thick oxide device can typically tolerate greater voltage stress than a thin oxide device. For example, a thick oxide device may be able to handle 5-volt or greater stress. A typical thick oxide thickness may be about 140 Angstroms. By using thick oxide devices, this will reduce oxide stress for these devices when interfacing with voltages above supply 817 at pin 820. Also, these thick oxide devices will be less likely to breakdown due to high voltages at pin 820. Therefore, the overall longevity and operation of the integrated circuit is enhanced.

Figure 9B:
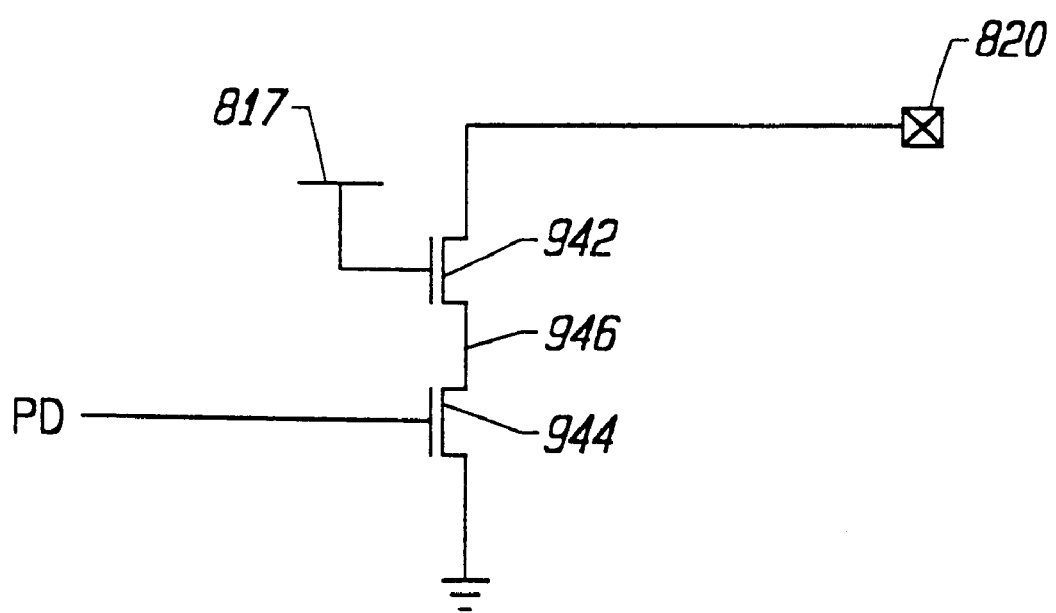
FIG. 9B shows a circuit diagram of an alternative circuit embodiment of a pull-down driver.

FIG. 9B shows an alternative pull-down circuitry for an output buffer such as shown in FIG. 9A. Transistors 942 and 944 would be used in substitution for MN3. A gate of transistor 942 is coupled to first supply 817. A gate of transistor 944 is coupled to PD. Transistors 942 and 944 are NMOS devices, and are thin oxide devices.

Although this pull-down circuitry is formed using thin oxide devices, it will be tolerant to high voltages at pin 820. Specifically, high voltages will be divided between the two transistors so neither device is subject to too high a voltage which would damage the devices. Transistor 942 limits a voltage at node 946 to VDD−VTN. The circuitry in FIG. 9B may be useful in cases to provide tolerance to high voltages, but where it is undesirable to use a thick oxide device, or when thick oxide devices are not available.

However, there may be some disadvantages when using two thin oxide devices compared to one thick oxide device. For example, more silicon area may be used by having two devices instead of one. Also, the performance when using two devices may be slightly less due to increased parasitics and other similar considerations.

For the above discussion, supply voltage 910 was described as 5 volts while supply voltage 817 was described as 3.3 volts. These values were given only for the purpose of example. As would be apparent to those skilled in the art, the circuitry would operate and function analogously for different, specific voltages where supply voltage 910 is above supply voltage 817. For example, supply voltage 910 may be 3.3 volts and supply voltage 817 may be 2.5 volts.

Figure 10A:
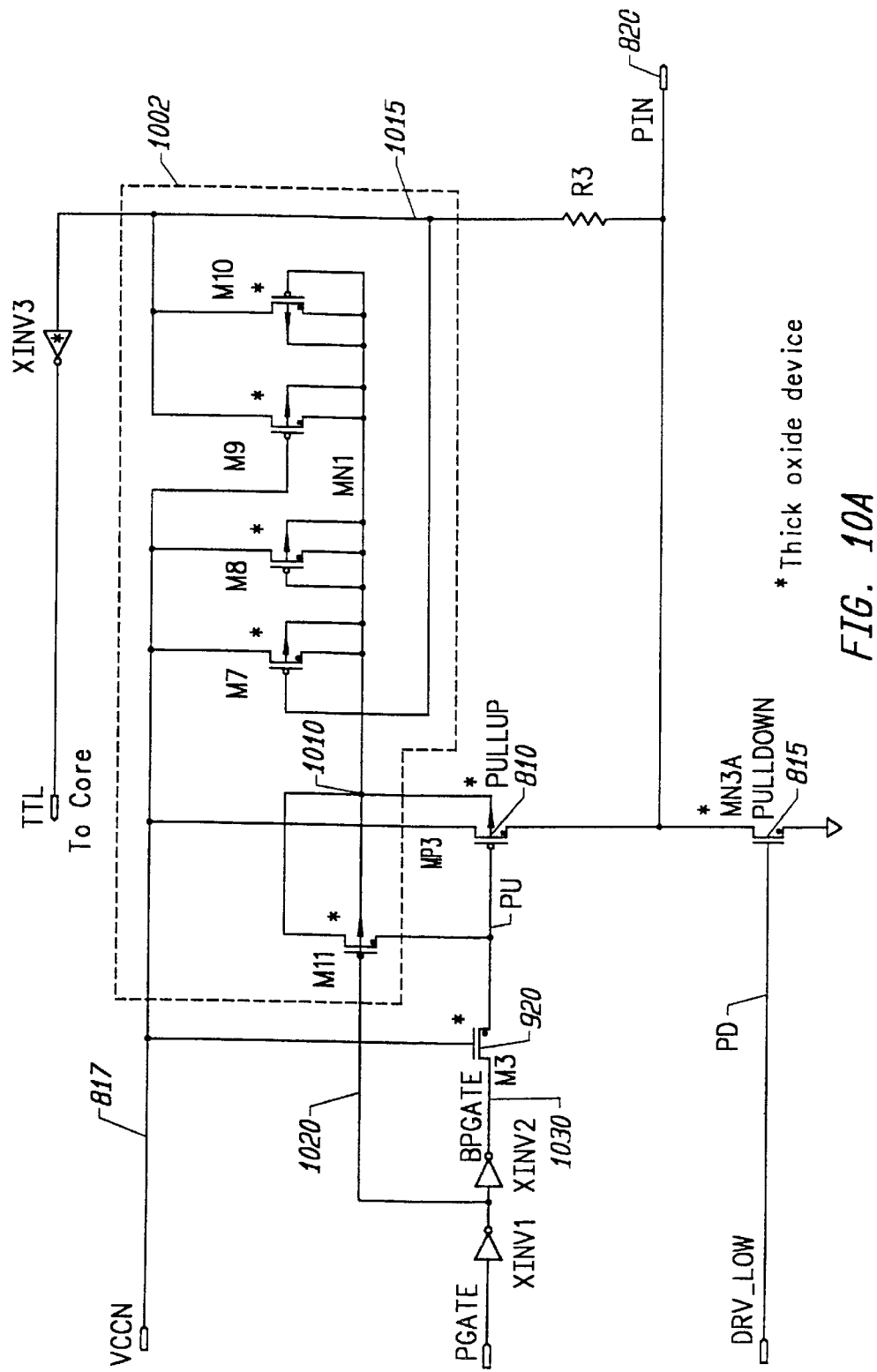
FIG. 10A shows a circuit diagram of a high-voltage tolerant output driver having a well bias generator.

FIG. 10A shows another output driver (or output buffer) which will allow interfacing with high voltages at pin 820. In this embodiment, a well bias generator 1002 is used to bias an n-well and a gate of pull-up driver 810. The output driver circuitry in FIG. 10A is similar to those shown in FIGS. 8 and 9. FIG. 10A also shows an input buffer XINV3 which is coupled to pin 820 for coupling signals to the core of the integrated circuit. A further discussion of the input buffer is presented below and in conjunction with FIGS. 10B, 10C, and 10D.

The embodiment in FIG. 10A has a supply voltage 817. The integrated circuit may have a "noisy" power supply (i.e., VCCN) and a "quiet" power supply (i.e., VCCQ). Both the noisy and quiet supplies may be connected to the same voltage level. However, the noisy power supply would be connected to a separate pin from a quiet power supply. On the integrated circuit, the noisy power supply would be connected to circuitry which generates or is subject to noise, while the quiet power supply would be connected to relatively quiet circuitry. By separating the power supplies in this fashion, the circuitry connected to the quiet power supply will be isolated somewhat from switching and other types of noise present on the noisy power supply.

The noisy supply would be connected to relatively noisy circuitry such as output drivers (e.g., supply voltage 817 may be a noisy supply). For example, output drivers generate noise from ground bounce. Further, in an integrated circuit such as shown in FIG. 5, the circuitry in interface 411 would generally be connected to the noisy supply since these circuits are typically considered "noisy." The circuits in core 405 would be connected to the quiet supply since these circuits are typically considered "quiet." This will tend to help prevent noise from coupling into the core of the integrated circuit.

In certain embodiments, such as will be described below, it may be desirable to couple certain devices (e.g., transistor 920 or others) to the second supply voltage, which would be a quiet supply voltage. Then, supply voltage 817 would be the noisy supply. In this embodiment, the devices are coupled to the same supply voltage 817, which may be a noisy or quiet supply. In a specific embodiment, supply voltage 817 will be a noisy supply voltage while the core of the integrated circuit is coupled to a quiet supply voltage.

Well bias generator 1002 includes transistors M7 and M8 which are coupled between supply 817 and a bias output node 1010. A gate of transistor M7 is coupled to a node 1015. A gate of transistor M8 is coupled to bias output node 1010.

Transistor M9 and M10 are coupled between a node 1015 and the bias output node 1010. A gate of transistor M9 is coupled to supply 817. A gate of transistor M10 is coupled to bias output node 1010.

Node 1015 is connected through a resistor R3 to pin 820. Resistor R3 may be used to provide electrostatic discharge (ESD) protection for devices M7, M9, M10, and XINV3 from pin 820. However, resistor R3 may be optionally omitted depending on the particular embodiment. Other techniques for ESD protection may be used.

Additionally, a transistor M11 is coupled between the bias output node 1010 and PU. An inverter chain including inverters XINV1 and XINV2 drive through pass transistor 920 to PU. Pass transistor 920 may be substituted with other pass gate structures. Pass transistor 920 may be substituted with a transmission gate, CMOS transmission gate (including an NMOS transistor and a PMOS transistor), two of more transistors in series, and many other specific circuit implementations. An output 1020 of XINV1 drives a gate of transistor M11.

In a preferred embodiment transistors M7, M8, M9, M10, and M11 are PMOS transistors. N-well connections for transistors M7, M8, M9, M10, and M11 are coupled to bias output node 1010.

In operation, well-bias generator 1002 generates a bias output voltage 1010 which is used to prevent currents I1 and I2 shown in FIG. 8. As shown in FIG. 10A, bias output node 1010 is coupled to then-well of pull-up driver 810. Furthermore, bias output node 1010 can be coupled or decoupled to the gate of pull-up driver 810 depending on the conditions.

More specifically, when PU is low, the output of inverter XINV1 will be high. In this case, transistor M11 will be off and effectively decoupled from node PU. This is the case when pin 820 is driven to a logic high. The I1 and I2 current paths are not of a concern.

On the other hand, when PU is high, the output of inverter XINV1 will be low. In this case, transistor M11 will be on. Transistor M11 will effectively couple bias output node 1010 to the gate of PU. Essentially, the gate of PU will track the voltage at gate bias output node 1010 in order to prevent current path I1 described above.

Voltage bias generator 1002 will be described in connection with the voltage conditions at pin 820. In particular, bias output node 1010 will be VCC (i.e., the level at supply voltage 817) when pin 820 is in a range from ground to about VCC–|VTP|. VCC is the voltage at supply 817, and |VTP| is the threshold voltage for a PMOS transistor. Bias output node 1010 is coupled to VCC through transistor M7, which will be in a conducting or on state. Under these conditions, voltage bias generator 1002 prevents I1 and I2 current paths. Specifically, the gate and n-well of pull-up driver 810 will be biased to VCC. Since VPIN (i.e., the voltage level at pin 820) will be less than VCC, I1 and I2 will be zero.

In the case when pin 820 is above about VCC–|VTP| but below about VCC, transistor M7 will be off. Bias output node 1010 will be held to about VCC–|VTP| through transistor M8. Note that transistor M8 may be substituted with a diode or similar device or component. For example, the p-n junctions of the transistors 810, M7, and M8 form such a diode. This would serve a similar function of maintaining bias output node 1010 at around VCC–VF. VF is the forward voltage of the diode. Under these conditions, voltage bias generator 1002 keeps the gate and n-well of pull-up driver 810 biased properly. The I1 and I2 current paths are not of concern.

In the case when pin 820 goes above VCC, but below about VCC+|VTP|, bias output node 1010 will be about VPIN–|VTP|, where VPIN is a voltage level at pin 820. Bias output node 1010 will be held at this level through transistor M10. Transistor M10 acts like a diode, analogous to transistor M8. Similarly, transistor M8 may also be substituted with a diode structure or other device or component as discussed in the case for transistor M8. For example, such a diode is present in the p-n junctions of transistors M9 and M10. Under these conditions, the gate and n-well of pull-up driver 810 will be about VPIN–|VTP|. The I1 and I2 current paths will not be of concern. If |VTP| were slightly greater than the VF of diode 830 (see FIG. 8), then there may be a relatively small current I2. However, I2 would be zero when |VTP| is less than the VF of diode 830.

In the case when pin 820 goes above about VCC+|VTP|, bias output node 1010 will be VPIN. VPIN will be passed through transistor M9. Transistor M9 will be in a conducting state under these conditions. Under these conditions, the gate and n-well of pull-up driver 810 will be the same as VPIN. In this case, current paths I1 and I2 will also not occur.

Therefore, as described above, voltage bias generator 1002 prevents the I1 and I2 sneak current paths in the case when a voltage above supply voltage 817 is placed at pin 820. For example, an integrated circuit with a 3.3-volt supply voltage may be driven with a 5-volt input voltage. The output driver circuitry shown in FIG. 10A may be used in implementing the second option (shown in FIG. 5) for a mixed voltage mode capable integrated circuit.

In a preferred embodiment for the circuitry in FIG. 10A, as discussed previously, pull-down driver 815 and transistor M11 should be thick oxide devices. This is to ensure the gate oxide reliability at different voltage stress conditions. For pull-down driver 815, a stress condition occurs when pin 820 is at about 5 volts and node PD is grounded. For transistor M11, a stress condition occurs when pin 820 is at about 5 volts, which makes node 1010 about 5 volts, and node 1020 will be at about ground. Further, the |VTP| for thick oxide devices may differ from the |VTP| for thin oxide devices. Therefore, transistors M7 and M9 may also be thick oxide devices in order to ensure they have a similar |VTP| as pull-up driver 810. This is important in order that voltage bias generator 1002 track the characteristics of pull-up driver 810 properly. However, if |VTP| for thin oxide devices is less than that for thick oxide devices, then transistors M7 and M9 may be thin oxide devices. This is because the difference between the voltage at pin 820 and PU will be less |VTP| of pull-up transistor 810. This ensures no I1 current path.

Transistors M3, M8, and M10 may also be thick oxide devices. Depending on the process technology used, there may be advantages to using thick oxide devices such as providing improved gate oxide stress tolerance, tracking of device parameters between devices, and other factors.

Further, devices M3, M7, M8, M9, and pull-up driver 810 may also be thick oxide devices to improve their oxide reliability. For example, an oxide stressing condition may occur when supply 817 is off, and pin 820, node 1015, and node PU are at 5 volts.

In an embodiment of the present invention, the control electrode of pass transistor 920 may be coupled to a noisy supply (VCCN) or the quiet supply (VCC(VCCQ). This connection may be made using a programmable option, such as by programmable link, fuse, programmable bit, and metal mask, just to name a few of the possible techniques. When the control electrode of transistor 920 is coupled to VCCQ, the other. devices are coupled to supply 817, which would be VCCN.

In a situation when a voltage level of the VCCN is below that of VCCQ (e.g., VCCN is less than 3.3 volts and VCCQ is 3.3 volts; VCCN is less than 2.5 volts and VCCQ is 2.5 volts), then the control electrode of transistor 920 should be coupled to VCCN. This prevents leakage from VCCQ to VCCN through transistor 920 since a node 1030 at the output of XINV2 will be limited to VCCN–VTN; regardless of the voltage level at PU.

Another example where the control electrode of pass transistor 920 should be coupled to VCCN is when VCCQ is about 3.3 volts and VCCN is about 2.5 volts. Under those circumstances, allow for ten percent tolerances on the VCCN and VCCQ, VCCQ may be about 3.6 volts and VCCN may be about 2.25 volts. If the control electrode of pass transistor 920 were coupled VCCQ of 3.6 volts, bias output node 1010 may be 2.25 volts, and node PU will be about VCCQ–VTN, which is approximately 2.6 volts. Then, when node 1020 is zero volts, there will be current flow through M11, since this device is on. This current flow will be from PU (at 2.6 volts) to bias output node 1010 (at 2.25 volts) and to the pin 820. To minimize this current, M11 may be made into a weak transistor (e.g., by sizing the device).

Another solution is to connect the control electrode of pass transistor 920 to VCCN. This will limit the voltage at PU so that nothing will be driving PU when PU reaches VCCN–VTN.

FIGS. 10B–10I show various implementations of an input buffer of the present invention. Input buffer XINV3 in FIG. 10A may be implemented using these circuit implementations.

Figure 10B:
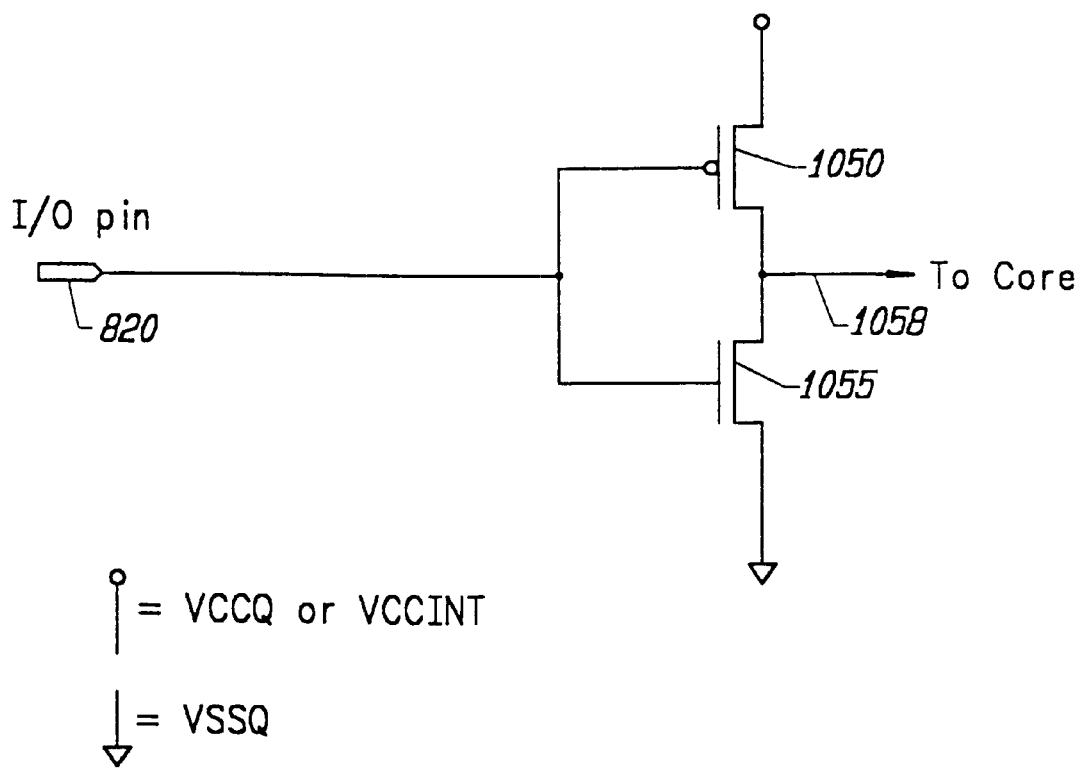
FIG. 10B shows an implementation of an input buffer.

FIG. 10B shows an implementation of an input buffer using an inverter circuit configuration. A transistor 1050 and a transistor 1055 are coupled in series between a positive supply and ground. Control electrodes of the two transistors are coupled together, and coupled to pin 820. An output 1058 from the inverter is taken from a node between the two inverters. Output 1058 is coupled to drive the core of the integrated circuit. The positive supply may be VCCQ or VCCint.

In a specific embodiment, transistor 1050 is a p-channel device and transistor 1055 is an n-channel device. As discussed above, pin 820 may be subject to voltages above VCCQ or VCCint. For example, pin 820 may be at about 5 volts and VCCQ or VCCint will be about 3.3 volts. In order to minimize oxide stress and improve reliability of the input buffer, transistors 1050 and 1055 may be thick oxide devices, individually or in combination.

Furthermore, the input threshold trip point of the inverter may be programmable. The input threshold trip point depends on the ratio of the relative strengths of the ratio of the pull-up transistor 1050 to the pull-down transistor 1055.

Therefore, the trip point may be varied by adjusting the W/L ratio of transistor 1050 to transistor 1055. The sizes of transistors 1050 and 1055 may be adjusted by programmable option. For example, by metal mask option, the trip point may be adjusted as desired for the intended application.

A programmable threshold input buffer is especially useful for an integrated circuit which will interface with various voltage supplies and voltage levels. For example, the input threshold may be adjusted to adapt the integrated circuit for use in 2.5-volt or 1.8-volt supply environments. Furthermore, in situations when VCCQ is above VCCN (e.g., VCCQ is 3.3 volts and VCCN is 2.5 volts), the input level specification for the case when VCC is 2.5 volts may be violated since VCCQ is actually 3.3 volts. A programmable threshold input buffer will be able to handle the situation to set the input threshold appropriately.

Figure 10C:
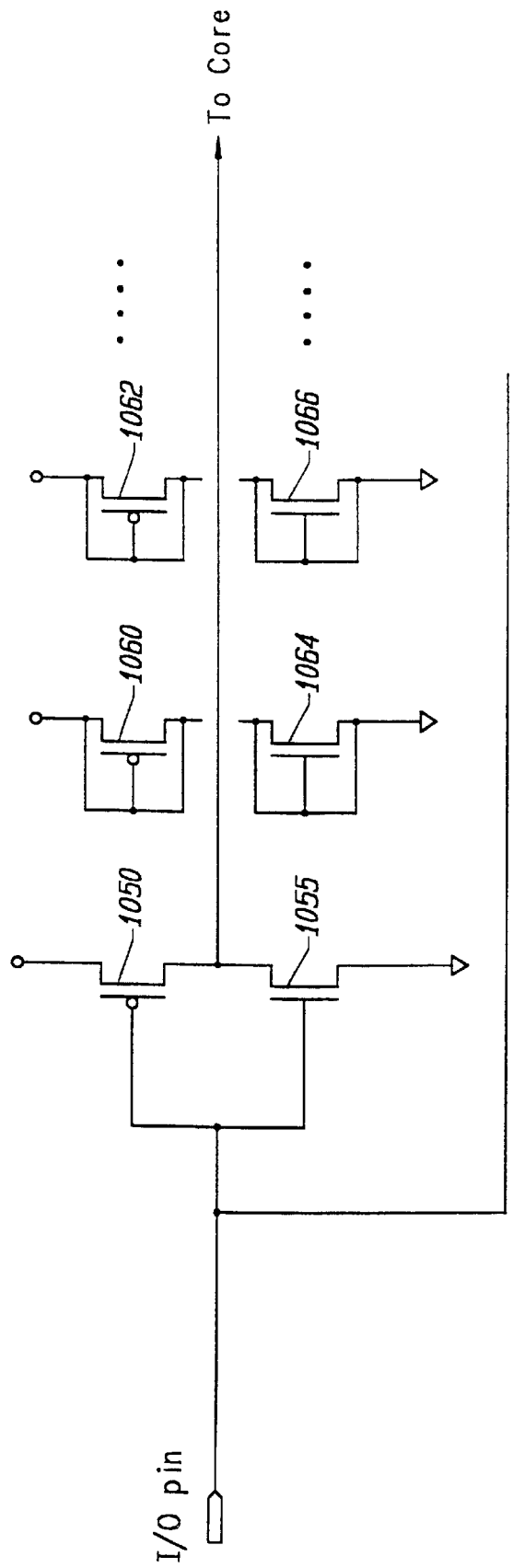
FIG. 10C shows an implementation of a buffer having a programmable input threshold trip point using programmable options.

FIG. 10C shows an example of an implementation of the input buffer in FIG. 10B using programmable metal options, such as by selecting an appropriate metal mask. The effective size (or strength) of transistor 1050 may be adjusted using transistors 1060 and 1062. Similarly, the effective size (or strength) of transistor 1055 may be adjusted using transistors 1064 and 1066. Transistors 1060, 1062, 1064, and 1066 are provided in the layout, and are optionally connected in parallel with transistors 1050 and 1055. Although only a particular number of "option" transistors 1060, 1062, 1064, and 1066 are shown, there may be as many option transistors as desired. The option transistors may be of varying sizes, which may be used to fine-tune the input threshold trip point.

Figure 10D:
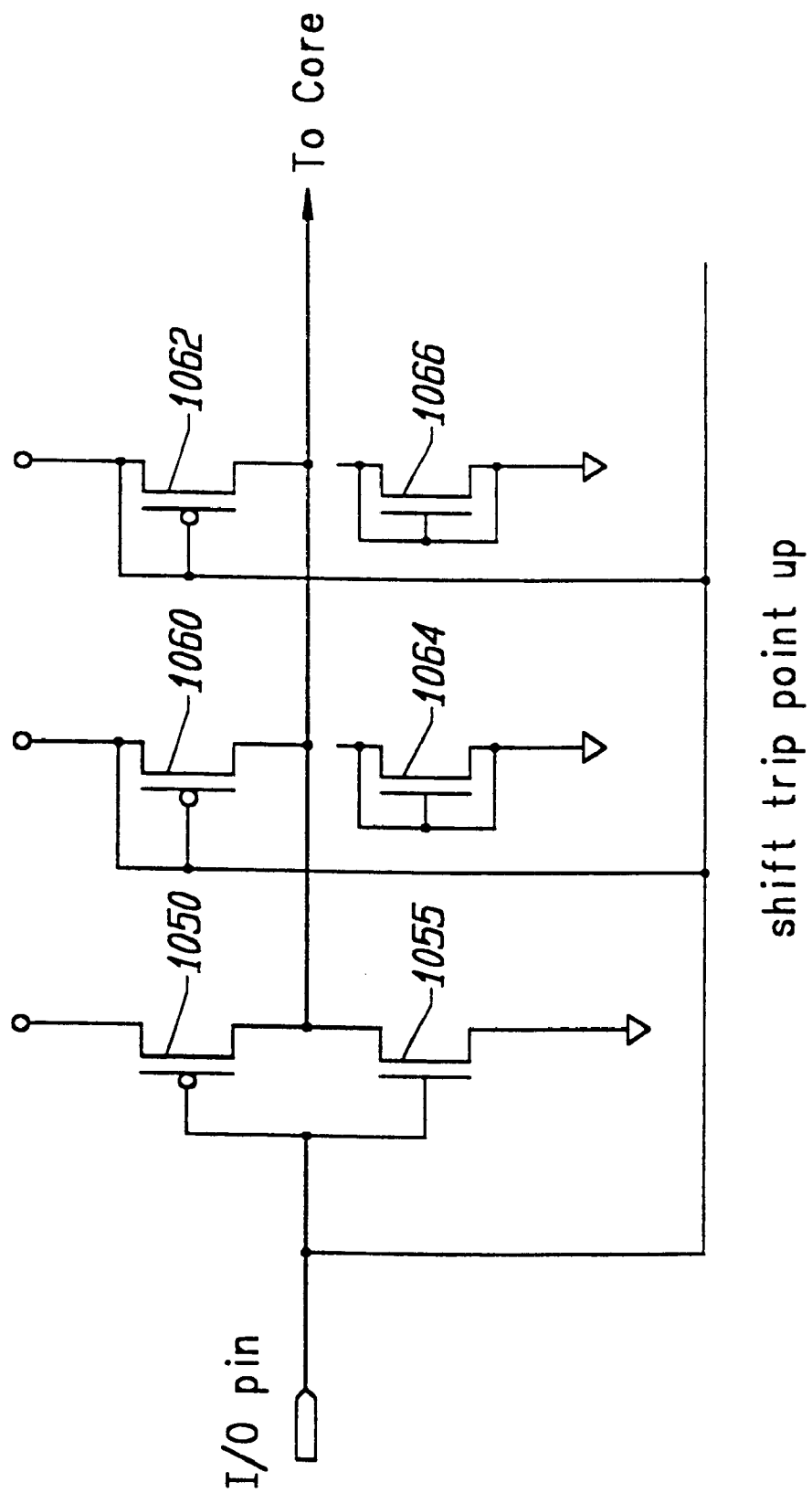
FIG. 10D shows a buffer with a programmable input threshold configured to shift the trip point up.
Figure 10E:
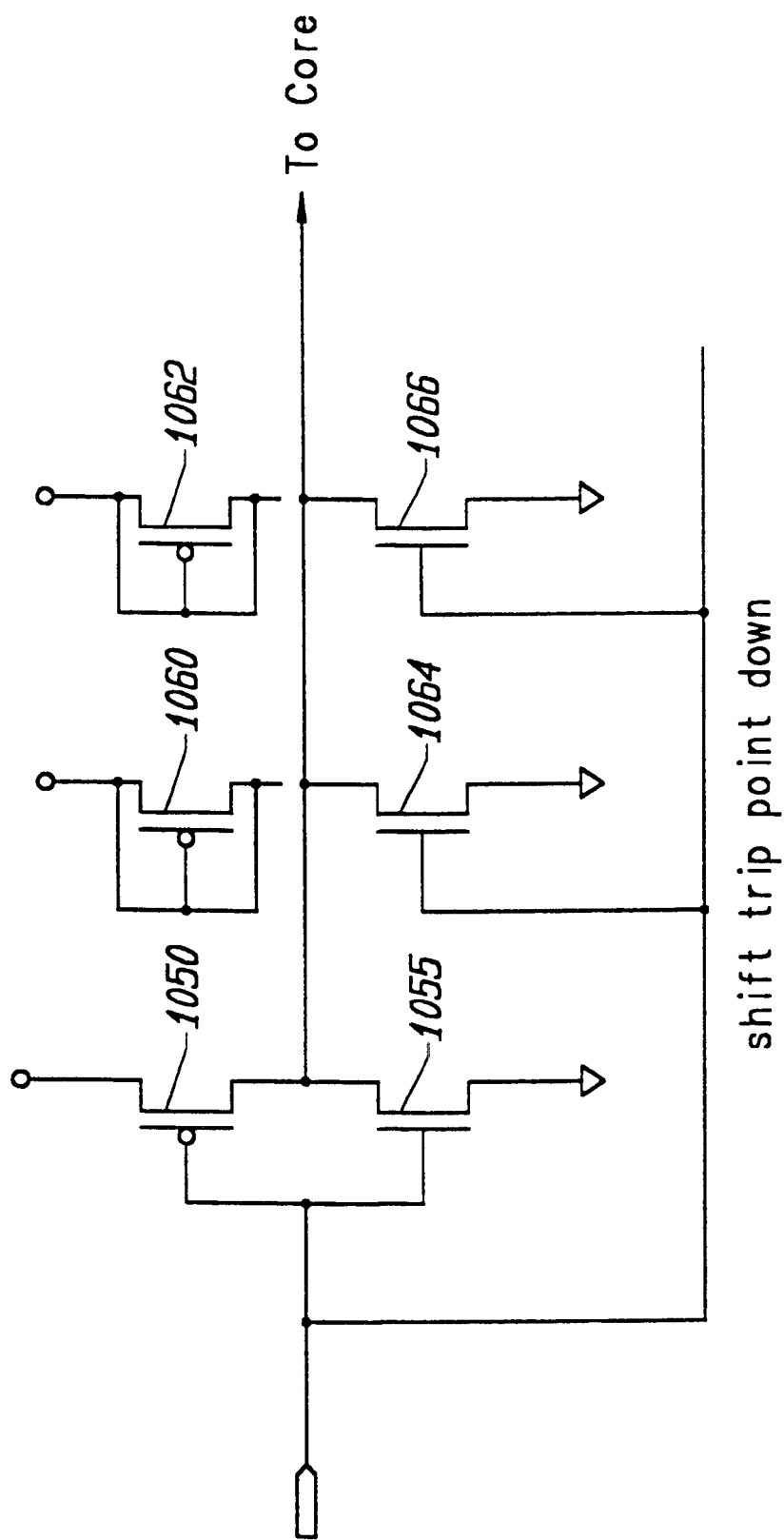
FIG. 10E shows a buffer with a programmable input threshold configured to shift the trip point down.

For example, FIG. 10D shows how the input threshold trip point may be shifted up by coupling option transistors 1060 and 1062 in parallel with transistors 1050. FIG. 10E shows how the input threshold trip point may be shifted down by coupling option transistors 1064 and 1066 in parallel with transistor 1055.

In order to provide greater oxide stress tolerance, option transistors 1060, 1062, 1064, and 1066 may be thick oxide devices, as was discussed for transistors 1050 and 1055.

Figure 10F:
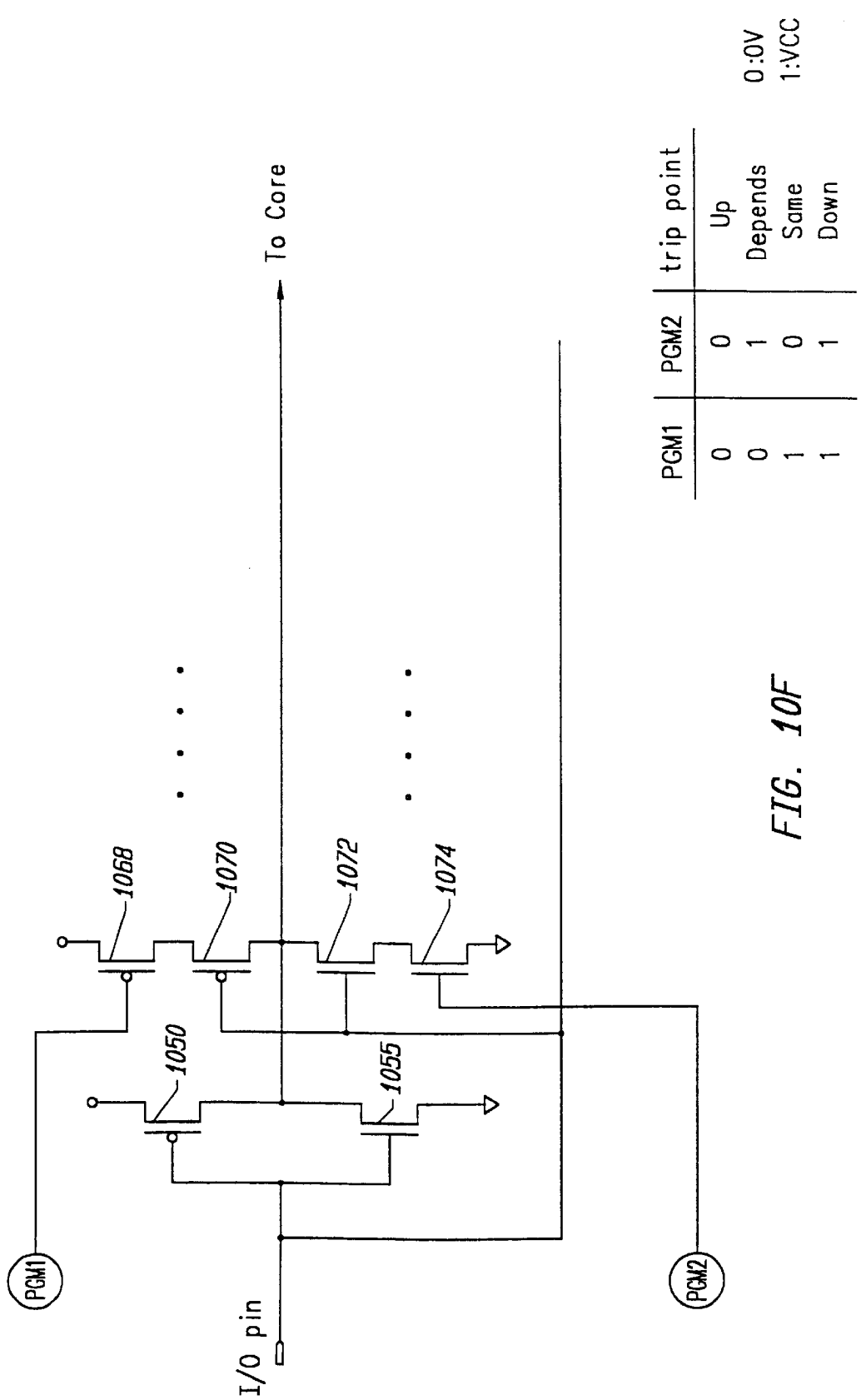
FIG. 10F shows another implementation of a buffer having a programmable input threshold trip point.

FIG. 10F shows another embodiment of a programmable input threshold buffer. This buffer may also be used to implement buffer XINV3 in FIG. 10A. The circuitry includes transistors 1050 and 1055, as was discussed for FIG. 10B. The threshold may be adjusted using transistors 1068 and 1070, and transistors 1072 and 1074. There may be additional branches of transistors, similar to transistors 1068 and 1070, and 1072 and 1074, in parallel with transistors 1050 and 1055. These additional branches of transistors would allow greater flexibility and precision in the adjustment of the input threshold, similar to the multiple metal option transistors in FIG. 10C.

Transistors 1068, 1070, 1072, and 1074 are coupled in series between a positive supply and ground. The positive supply may be VCCQ or VCCint in a multiple positive supply system. A control electrode (or gate) of transistor 1068 is coupled to a first programmable element PGM1. Control electrodes of transistors 1070 and 1072 are coupled to an input pin. A control electrode of transistor 1074 is coupled to a second programmable element PGM2. The programmable elements may be programmed to represent a logic high or logic low.

The programmable elements may be implemented using mask options. SRAM cells, RAM cells, EPROM cells, EEPROM cells, Flash cells, fusees, antifuses, ferroelectric memory, ferromagnetic memory, and many other technologies. For example, PGM1 or PGM2, or both, may be controlled by logic signals from within a programmable logic device.

By appropriately programming PGM1 and PGM2, the input threshold is shifted up or down. For example, when PGM1 and PGM2 are logic low, the input threshold trip point is shifted up. When PGM1 and PGM2 are logic high, the input threshold trip point is shifted down. When PGM1 is logic high and PGM2 is logic low, the input threshold trip point will not be adjusted. When PGM1 is logic low and PGM2 is logic high, the input threshold trip point may be adjusted, depending on the ratio of transistors 1068 and 1070 to transistors 1072 and 1074. The transistors 1070 and 1072 may be thick oxide devices.

Figure 10G:
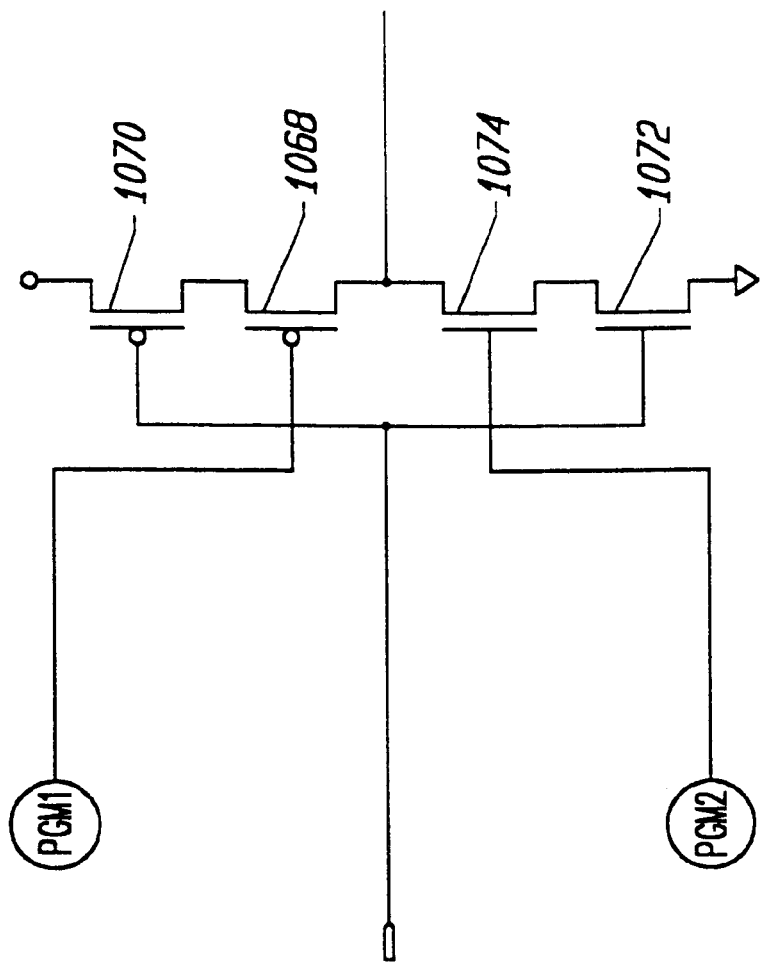
FIG. 10G shows an alternative circuit configuration for the buffer circuitry in FIG. 10F.

FIG. 10G shows an alternative configuration for transistors 1068, 1070, 1072, and 1074 of FIG. 10F. The arrangement of the transistors is different but the functionality is similar.

Figure 10H:
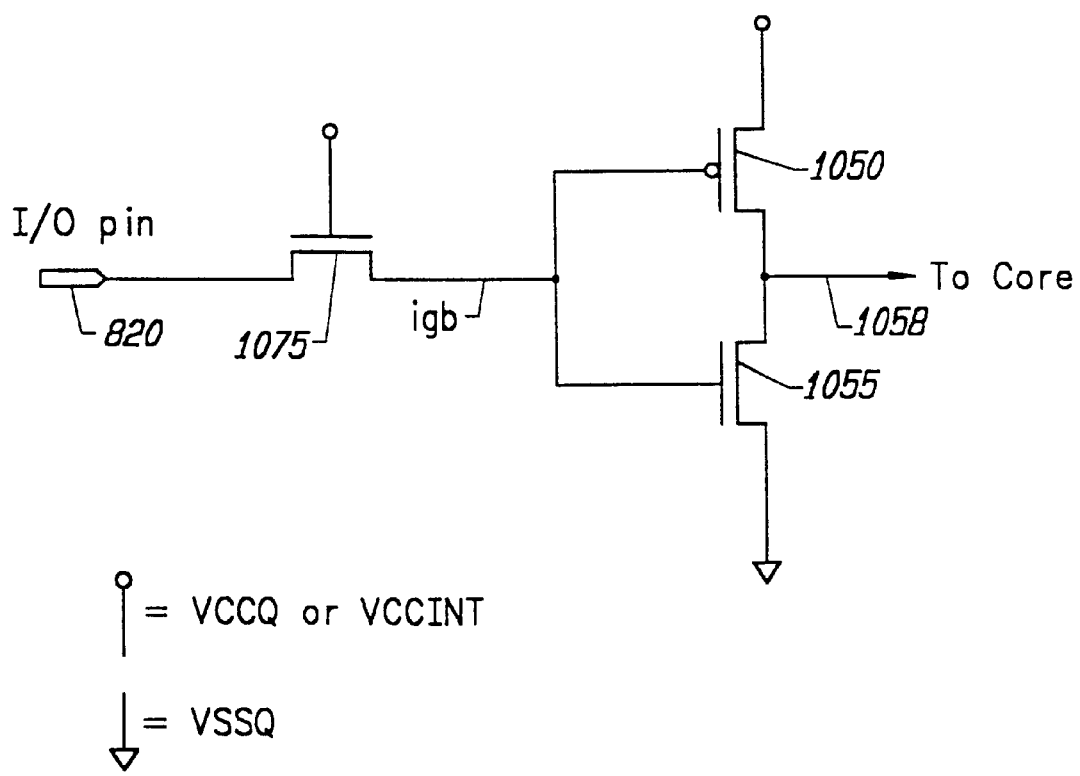
FIG. 10H shows a further input buffer implementation.

FIG. 10H shows a further embodiment of an input buffer of the present inverters. The circuitry in FIG. 10H is similar to that in FIG. 10B, with the addition of a transistor 1075 coupled between pin 820 and a node igb at an input of the inverter formed by transistors 1050 and 1055. A control electrode of transistor 1075 is coupled to the positive supply, which may be VCCQ or VCCint in a multiple supply integrated circuit.

In this embodiment, transistors 1050 and 1055 may be thin oxide devices while transistor 1075 is a thick oxide device. Thick oxide transistor 1075 will serve as isolation for thin oxide transistors 1050 and 1055, to minimize stress on the gate oxide of transistors 1050 and 1055.

The buffer circuit in FIG. 10H may be slower than that in FIG. 10B due to the isolating pass transistor 1075. Furthermore, there may be DC power consumption. Node igb will be one VTN below VCCQ (i.e., the voltage at the control electrode of transistor 1075), and there may be current flowing through transistors 1050 and 1055 since transistor 1050 may still be conducting with VCCQ−VTN at its control electrode.

Furthermore, the input threshold of the buffer may be programmable such as by using techniques as described above and shown in FIGS. 10F and 10G.

Figure 10I:
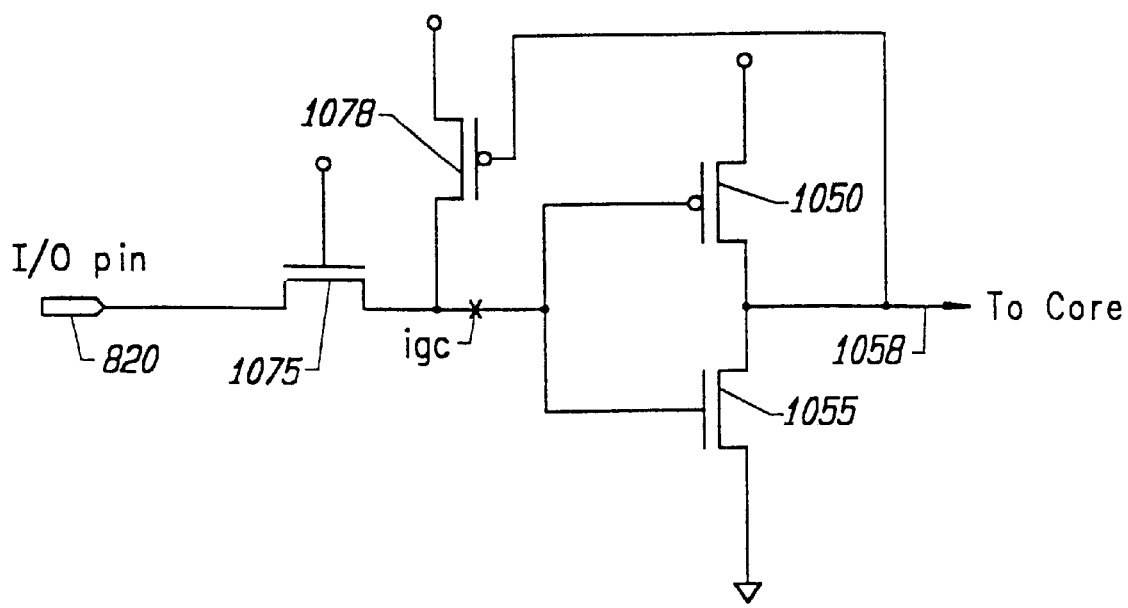
FIG. 10I shows another input buffer implementation including a half latch.

FIG. 10I shows another embodiment of an input buffer of the present invention. This embodiment shares similarities to the circuits in FIGS. 10B and 10H. The circuitry in FIG. 10I further includes a transistor 1078 coupled between the positive supply (i.e., VCC, VCCint, or VCCQ) and a node igc. A control electrode of transistor 1078 is coupled to an output of the buffer. As in FIG. 10H, transistor 1075 is a thick oxide device which isolates thin oxide devices 1050 and 1055 from high voltage oxide stress, as discussed.

Transistors 1078 acts as a p-channel half latch to restore the voltage level at node igc to VCCQ when the input (i.e., pin 820) is a logic high. In FIG. 10I, the control for the half-latch is taken from an output of the buffer, however, there are many circuit configurations which would accomplish a similar logical function. By ensuring node igc is restarted to VCCQ, this minimizes static or DC power consumption because transistor 1050 will be fully off (as compared to the circuit configuration in FIG. 10H). However, transistor 1078 may contribute some DC leakage current at the I/O pin.

Furthermore, the input threshold of the buffer may be programmable such as by using similar techniques as described above and shown in FIGS. 10F and 10G.

Figure 11:
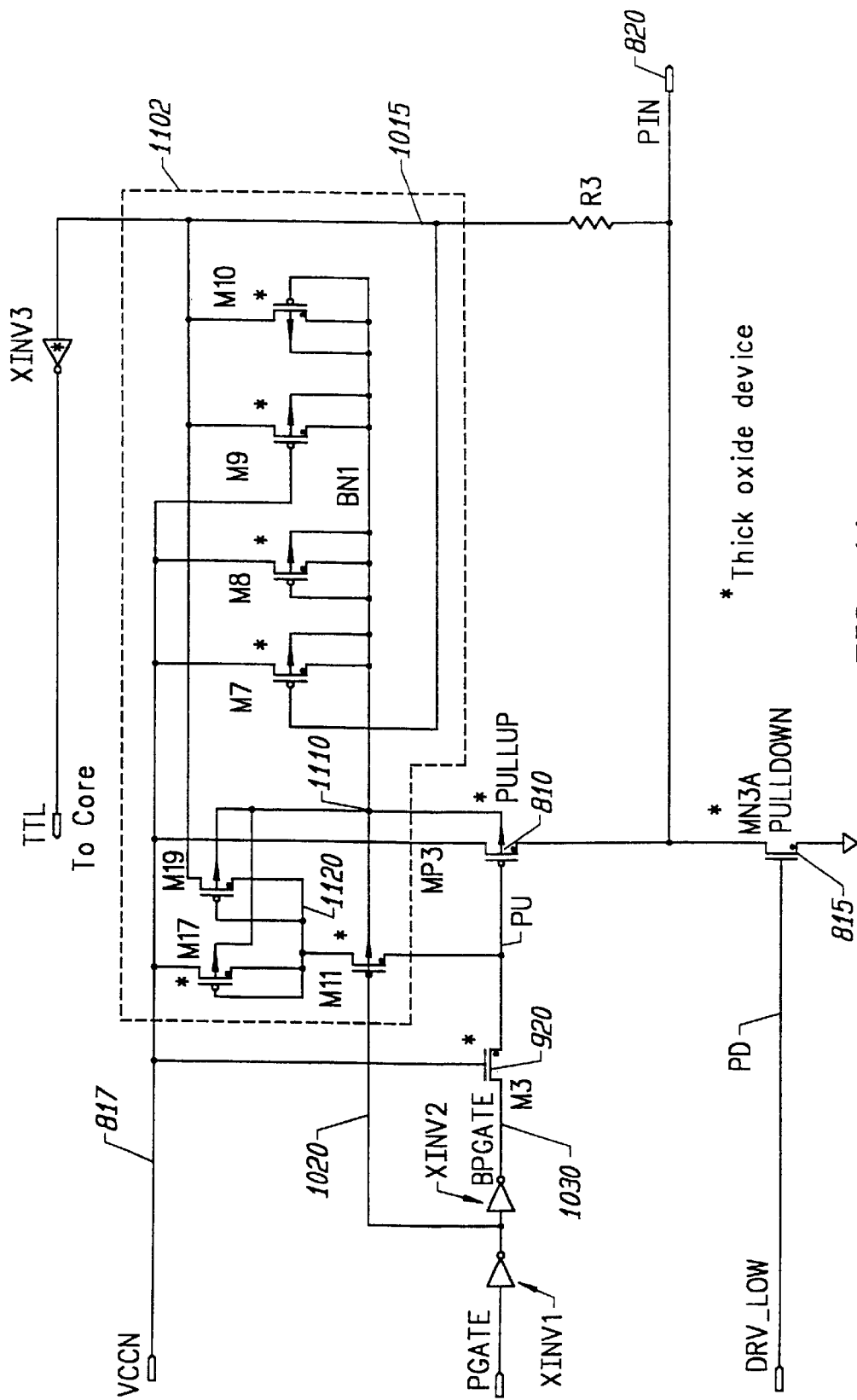
FIG. 11 shows a circuit diagram of another high-voltage tolerant output driver having a well bias generator.

FIG. 11 is a diagram of a further embodiment of the voltage bias generator of the present invention. In FIG. 11, a voltage bias generator 1102 is similar to voltage bias generator 1002 of FIG. 10A. Only the differences between voltage bias generator 1102 and voltage bias generator 1002 will be discussed.

Voltage bias generator 1102 has a bias output node 1110 which is coupled to the n-well of pull-up driver 810. Transistors M7, M8, M9, and M10 are configured and operate similarly as the similarly labeled transistors in voltage bias generator 1002. These transistors generate the voltage at bias output node 1110.

A voltage at PU is generated by transistors M17, M19, and M11A, in contrast to a single transistor M11 in the embodiment of FIG. 10A. Transistor M17 is coupled between first supply 817 and a node 1120. A control electrode of transistor M17 is coupled to node 1120. Transistor M19 is coupled between node 1015 and node 1120. A control electrode of transistor M19 is coupled to node 1120. Transistor M11A is coupled between node 1120 and PU. A control electrode of transistor M11A is coupled to an output of inverter XINV1.

In a preferred embodiment, transistors M17, M19, and M11A are PMOS devices. N-well connections for these transistors are coupled to bias output node 1110.

In operation, when PU is low, the output of inverter XINV1 will be high. In this case, transistor M11A will be off and effectively decoupled from node PU. This is the case when pin 820 is driven to a logic high. The I1 and I2 current paths are not of a concern.

On the other hand, when PU is high, the output of inverter XINV1 will be low. In this case, transistor M11A will be on. Transistor M11 will effectively couple a voltage at node 1120 to node PU. This voltage at PU is used to prevent current path I1 described above. Transistors M17 and M19 will operate analogously to transistor M8 and M10 to bias the voltage at PU. The operation of this circuitry will be described in relation to the voltage at pin 820.

When VPIN is less than about VCC, the circuitry will drive PU to about VCC−|VTP| through transistors M17 and M11A. This is analogous to the operation of transistor M8, which was described above. Therefore, the I1 current path will be prevented under these conditions.

When VPIN is above about VCC, the circuitry will drive PU to about VPIN−|VTP|. This is analogous to the operation of transistor M10, which was described above. In this case, the I1 current path will also be prevented since PU will be within a |VTP| of VPIN.

Therefore, voltage bias generator 1102 in FIG. 11 operates similarly to voltage bias generator 1002 in FIG. 10A. This is because transistor M17 serves a similar function as transistor M8, and transistor M19 serves a similar function as transistor M10. For voltage bias generator 1002, a similar voltage that is provided at node 1120 is taken from bias output node 1010 instead. The circuit configuration in FIG. 10A is preferred since fewer transistors are required. Otherwise, the operation of both voltage bias generator circuits is largely functionally equivalent.

In different embodiments of the present invention, some of the devices may be thick oxide devices as was discussed in FIG. 10A. For example, as was discussed above, pull-down driver 815 and transistor M11 should be thick oxide devices to improve their oxide stress reliability. To ensure a similar VTP, transistors M7 and M9 may be thick oxide devices. Transistors M8, M3, M17, and pull-up driver 810 may also be thick oxide devices in order to improve their oxide reliability. M10 and M19 may be thick oxide devices.

Figure 12:
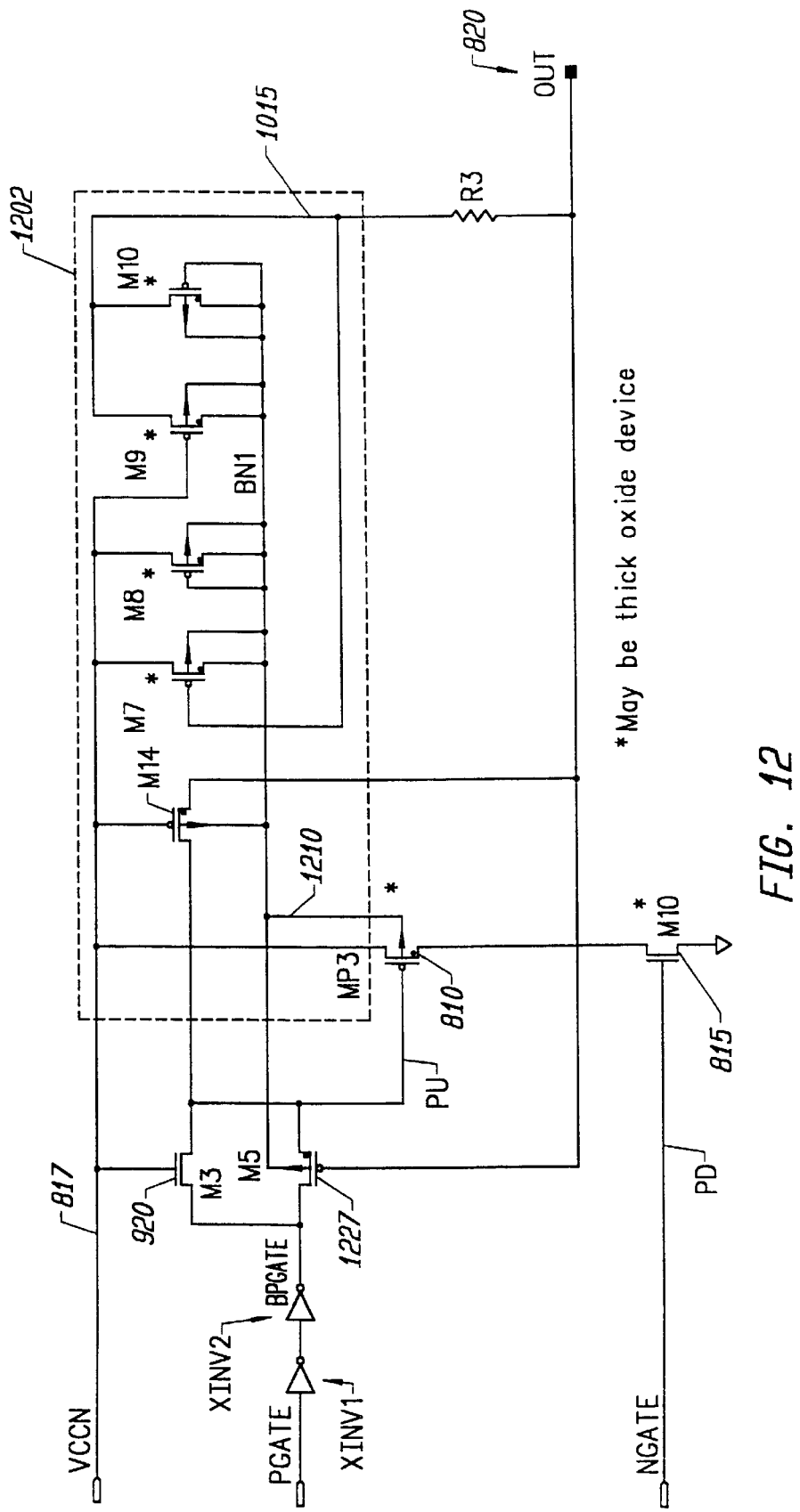
FIG. 12 shows a circuit diagram of a further embodiment of the high voltage tolerant output driver having a well bias generator.

FIG. 12 shows another embodiment of a voltage bias generator 1202 of the present invention. This voltage bias generator shares similarities with those shown in FIGS. 10 and 11. The differences between the circuits will be described below.

Voltage bias generator 1202 is similar to voltage bias generator 1002 of FIG. 10A. Transistors M7, M8, M9, and M10 are configured and operate similarly to the similarly labeled transistors in FIG. 10A. A bias output node 1210 is coupled to the n-well connection of pull-up driver 810. Voltage bias generator 1202 will prevent the I2 current path, as was previously described.

In this embodiment, a transistor M14 is coupled between pin 820 and PU. A control electrode of transistor M14 is coupled to first supply 817. A pass transistor 1227 is coupled in parallel with pass transistor 920. A control electrode of pass transistor 1227 is coupled to pin 820. In a preferred embodiment, transistor M14 and pass transistor 1227 are PMOS transistors. N-well connections for transistor M14 and pass transistor 1227 are coupled to bias output node 1210.

In operation, when VPIN is less than about VCC+|VTP|, transistor M14 will not conduct, and decouples pin 820 from PU. Also, when VPIN is less than about VCC−|VTP|, transistor 1227 will be on and allow a full-rail logic high voltage (e.g., 3.3 volts when VCC is 3.3 volts) to pass to PU. These transistors ensure the I1 current path will not be of a concern. These transistors ensure the voltage level at PU will be within about a |VTP| of VPIN, and consequently, there will be no I1 current path.

When VPIN goes above VCC−|VTP|, PU will track VPIN through transistor M14. Transistor M14 and pass transistor 1227 will not conduct. More specifically, the voltage at VPIN will be about VPIN−|VTP|. Under these conditions, the I1 current path will not be a concern since the VPIN will be within about a |VTP| of the voltage at PU.

Further, in an alternative embodiment of the present invention, pass transistor 920 is a native device. A native device is a transistor which has no or minimal VT adjust implant so that the transistor's threshold voltage (VTnative) is about zero volts or slightly above. For example, VTnative may be about 0.2 volts. In the case when VTnative is less than |VTP|, pass transistor 1227 may be omitted from the circuitry, thus saving some silicon area.

The circuitry would still function properly because the voltage at PU will be at least about VCC−VTnative. Specifically, when VCC is driven through pass transistor 920, the voltage at PU will be about VCC−VTnative. This ensures VPIN will be within a |VTP| of the voltage at PU. Therefore, current path I1 will be prevented.

In different embodiments of the present invention, some of the devices may be thick oxide devices as was discussed for FIGS. 10A and 11. For example, as was discussed above, pull-down driver 815 and transistor 1227 should be thick oxide devices to improve their oxide stress reliability. To ensure a similar VTP, transistors M7 and M9 may be thick oxide devices. Transistors M8, M3, M10, M14, and pull-up driver 810 may also be thick oxide devices in order to improve their oxide reliability.

Figure 13:
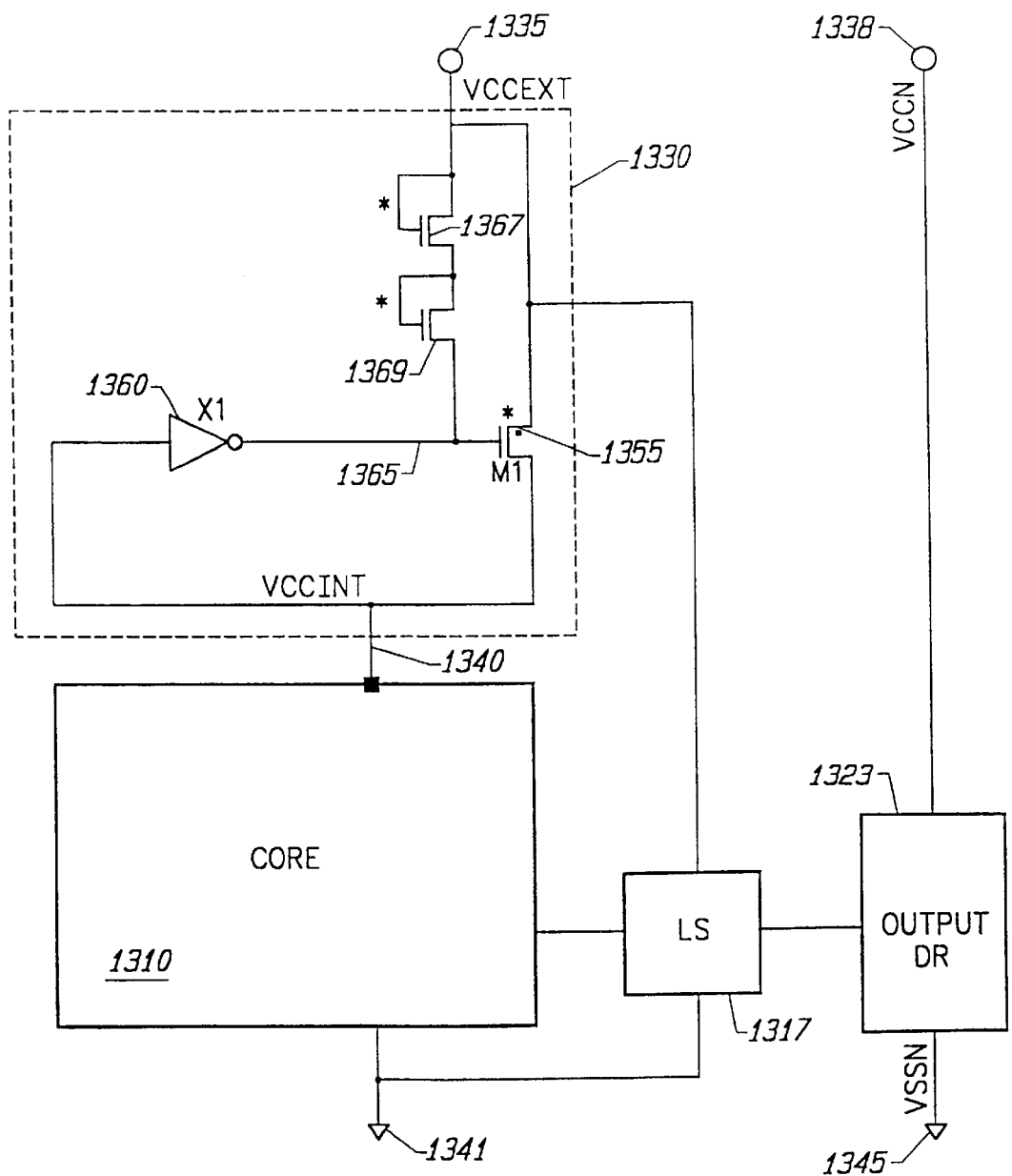
FIG. 13 shows a circuit diagram of a technique of interfacing an integrated circuit using a voltage down converter circuit.

FIG. 13 is a block diagram of an embodiment of the option (such as shown in FIG. 6) where the external power supplies provided to the integrated circuit will be at a higher voltage than the supply voltage used by the internal circuitry. Further, the interface circuits will interface with the high voltage level. For example, the internal circuitry may operate with a 3.3-volt supply (VCCint) while the external supply voltage (VCCext) is 5 volts. The input and output signals to the chip will be 5-volt compatible signals.

As shown in FIG. 13, the integrated circuit has a core 1310 which is coupled to a level shifter (LS) 1317. The core 1310, as discussed earlier, contains the internal circuitry of the integrated circuit which is not contained in interface 411 (see FIG. 6). For example, in a PLD or FPGA, core 1310 would include LABs, LEs, GVs, GHs, and other components and circuitry. In a microprocessor, core 1310 would include registers, adders, ALUs, instruction execution units, and other components. Interface 411 would contain, for example, the circuitry to generate output signals for the integrated circuit.

In the embodiment of the present invention shown in FIG. 13, there are separated quiet and noisy supplies, which were described previously. A quiet external supply voltage 1335 (i.e., VCCext) is provided to the integrated circuit. Using a voltage down converter (VDC) 1330, VCCext is converted to a lower supply voltage 1340 for the circuitry in core 1310. A noisy external supply voltage 1338 (i.e., VCCN) is coupled to an I/O driver 1323. VCCN may be at the same voltage level as VCCext. VCCN may also be at a different voltage level than VCCext. VCCN is used for interfacing "noisy" circuitry so that noise is not coupled into VCCext.

Furthermore, in the embodiment of FIG. 13, there is also a quiet and noisy ground supply, VSSQ 1341 and VSSN 1345, respectively. VSSQ is coupled to core 1310 while VSSN is coupled to I/O driver 1323. A quiet ground is separated from the noisy ground in order to prevent coupling of noise into the quiet ground.

In other embodiments of the present inventions, there may a single power supply VCC, separated noisy and quiet power supplies VCCext (or VCCQ) and VCCN, single ground VSS, separated noisy and quiet grounds VSSN and VSSQ, and combinations of these. For example, there may be a single power supply VCC coupled to both core 1310 and I/O driver 1323; however, there may be a noisy ground and a quiet ground. There may also be more than two separate supplies. For example, there may be separated grounds for different groupings of I/O drivers 1323 across the integrated circuit.

The number of power supplies used is somewhat dependent on the number of pins available for the integrated circuit. The number of power supply pins and ground pins available for the integrated circuit depend on the chip's die size, package used, and other considerations.

Level shifter 1317 converts signals from core 1310 into compatible signals for an I/O driver 1323. Level shifter 1317 is coupled to VCCext. For example, level shifter 1317 may convert the 3.3-volt logic signal to an equivalent 5-volt logic signal, which is used to drive I/O driver 1323. I/O driver 1323 generates 5-volt-compatible logic signals at a pin or pad.

I/O driver 1323 includes an output driver having a pull-up driver and a pull-down driver. For example, I/O driver 1323 may include pull-up driver 810 and pull-down driver 815 as shown in FIG. 8.

There is a voltage down converter (VDC) 1330 which converts VCCext into a VCCint voltage 1340, which is used by the internal circuitry of the integrated circuit. VCCint is a voltage less than VCCext. VCCint is coupled to and supplies the supply voltage for the circuitry in core 1310 of the chip. Voltage down converter 1330 is on-chip.

For example, VCCext may be 5 volts, the voltage down converter 1330 converts this voltage to a VCCint of about 3.3 volts, or possibly even lower. To users interfacing this integrated circuit, the chip would be appear to be a 5-volt compatible chip, while the internal circuitry operates at 3.3 volts. Moreover, in a PLD integrated circuit, for example, core 1310 may have 3.3-volt logic signals which are passed across a global interconnect through one or more LABs to level shifter 1317. Level shifter 1317 converts these logic into 5-volt compatible signals that are passed to the outside world.

In the present invention, because of the on-chip voltage down converter, a separate voltage regulator or voltage converter is not necessary. This saves space on a printed circuit board.

In voltage down converter 1330, a transistor 1355 is coupled between VCCext and VCCint. VCCint is coupled to an inverting amplifier 1360, which is coupled to a control electrode node 1365 of transistor 1355. Electrode node 1365 is clamped to VCCext using two diode-connected transistors 1367 and 1369. Depending on the process technology used, transistors 1367, 1369, and 1355 may be thick oxide devices to provide for greater gate oxide reliability. Transistor 1355 may be a thick oxide device in order to improve oxide reliability under conditions when node 1365 is about 4 volts or above.

Transistors 1367 and 1369 may be substituted with diodes and other similar voltage clamping devices. Transistors 1367 and 1369 operate to maintain electrode node 1365 within about two VTNs of VCCext. This minimizes gate oxide stress on transistor 1355. Therefore, in a preferred embodiment, when VCCext is 5 volts, the voltage level at electrode 1365 should be about 3.4 volts. A voltage level of about 3.4 volts, which is relatively close to the VCCint voltage, is desirable since it allows faster response time for the inverting amplifier to adjust for fluctuations in the voltages. Further, in a specific embodiment, when VCCint is about 3.4 volts, the current through transistor 1355 is designed to conduct a relatively small amount of current. For example, this current may be less than about one milliamp. Depending on the technology (e.g., voltage drop per voltage clamp) used and the design criteria, there may be more or fewer than two voltage clamps. For example, there may be only one voltage clamp or there may be three or more voltage clamps.

During operation, the voltage level at VCCint may fluctuate for a number of reasons including noise, fluctuations at VCCext, and voltage sag when core 1310 draws a large amount of current, just to name a few. Voltage down converter 1330 is self-regulating to obtain a relatively stable VCCint. As VCCint drops, inverting amplifier 1360 turns on electrode node 1365 more strongly, which increases conduction through transistor 1355. This increases VCCint. When VCCint is too high, the opposite effect occurs. Conduction through transistor 1355 is restricted to reduce VCCint. Therefore, voltage down converter 1330 generates a self-regulating VCCint, regulated using negative feedback.

As discussed above, in one embodiment, VCCint would be around 3.3 volts. And, the circuitry is implemented so that VCCint would not drop below 3 volts at predetermined voltage sag conditions. These conditions take into consideration the performance of the integrated circuit under the worst case operating conditions and voltages. The performance of the integrated circuit will also meet or exceed the specifications under the worst case operating conditions. Specifically, under these conditions, the response time for VCCint to the sag conditions does not cause speed or performance degradation since 3 volts would have been one of the worst case operating conditions. (This would be a worst case operating voltage.) This will also ensure the circuitry on the integrated circuit will operate and function properly.

In a preferred embodiment, transistor 1355 is an NMOS transistor. Transistor 1355 is shown as a single device, but may be multiple devices coupled in parallel. Transistor 1355 should be a rather large device in order to supply the power requirements of the integrated circuit.

An example of the power requirements is that 2.5 amps may be dynamically required during operation (i.e., AC switching). A width of transistor 1355 may be about 4500 microns. Transistor 1355 may be formed using about 750 smaller devices in parallel. Each individual device may be 6 microns in width.

In a preferred embodiment, the channel length should be greater than minimum in order to permit the transistor to handle greater voltage stresses. As a specific example, if the minimum drawn channel length for the process is 0.6 microns, the drawn channel length for transistor 1355 would be about 0.75 microns. This would improve the reliability of the device and avoid the effects of electromigration and hot electron degradation.

Figure 14:
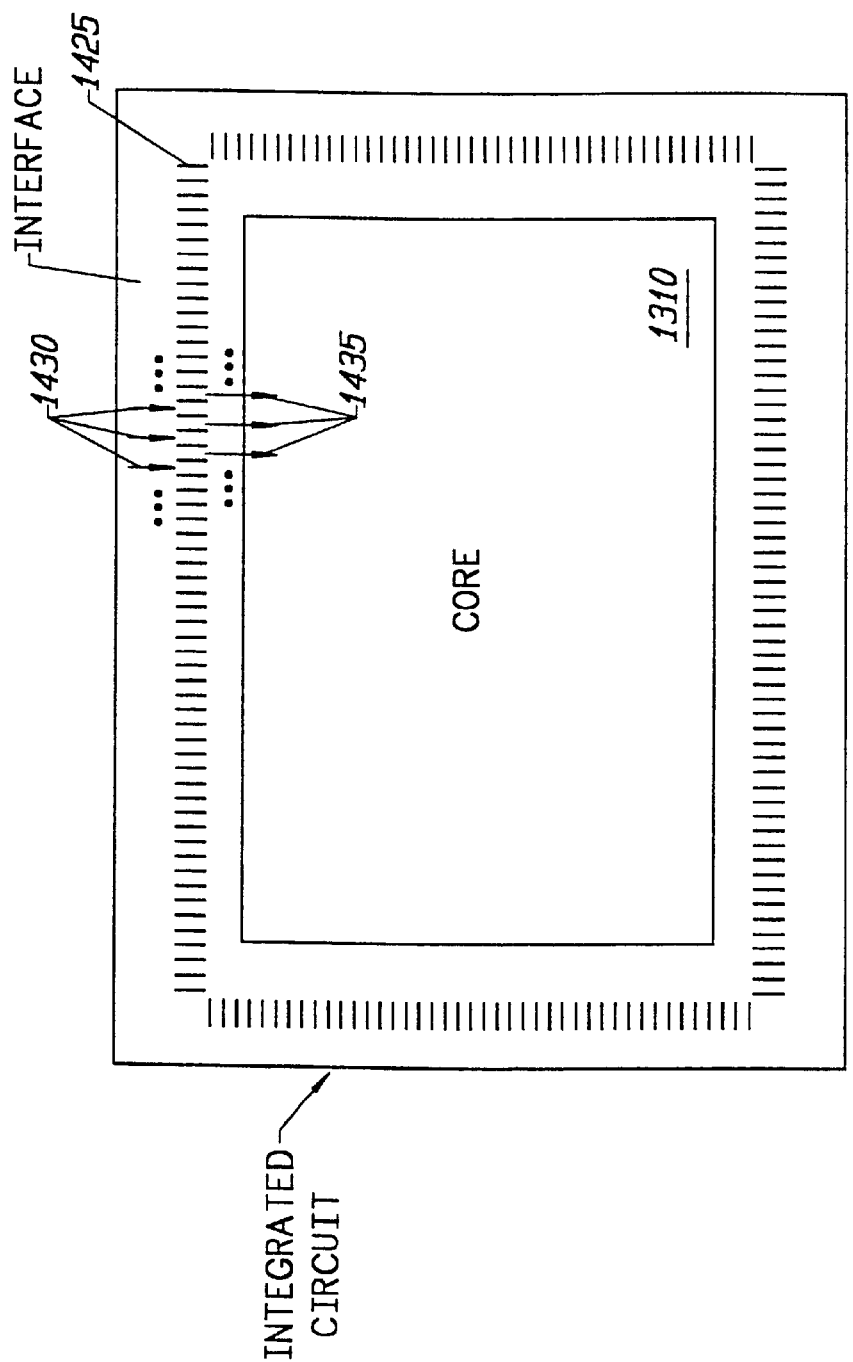
FIG. 14 shows an integrated circuit and a layout overview of components of the voltage down converter.

In order to distribute this power evenly across the entire integrated circuit, these individual devices may be evenly distributed surrounding the core of the integrated circuit as shown in FIG. 14. Transistor gates 1425 represent each of the individual gate widths for transistor 1355. These individual gate widths may be referred to as "fingers" of transistor 1355. Transistor 1355 is fed by VCCext using bus 1430, while transistor 1355 supplies VCCint internal to bus 1435.

Figure 15:
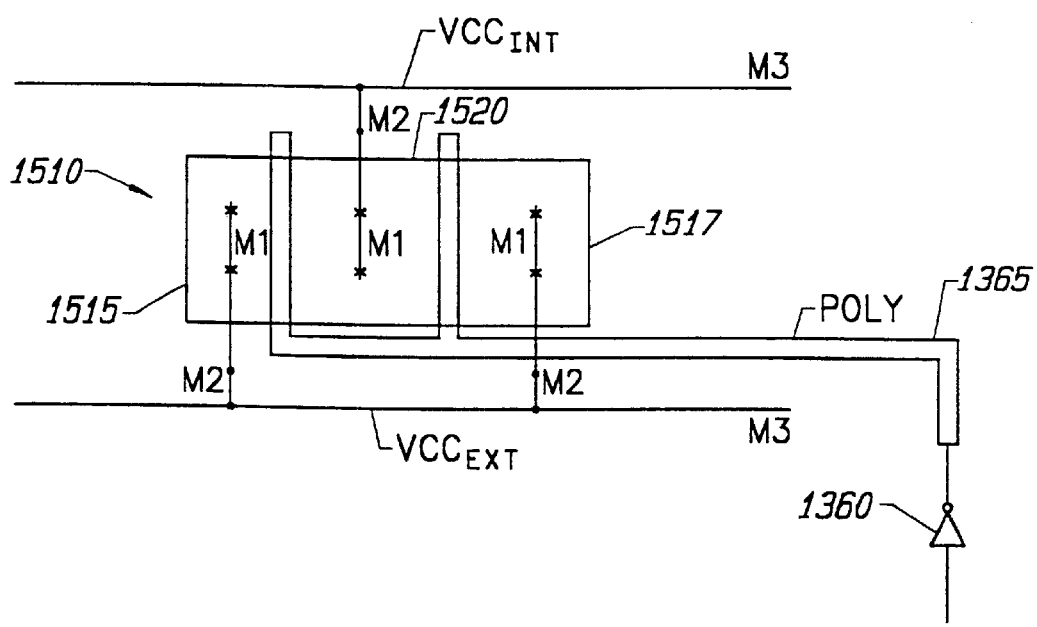
FIG. 15 shows a simplified layout diagram of fingers of a device of the voltage down converter.

FIG. 15 shows a more detailed diagram of a layout of an individual transistor 1510 used to form transistor 1355. Metal-3 buses are used to distribute VCCint and VCCext. Diffusion regions 1515 and 1517 are coupled to VCCext using metal-1 which is coupled to metal-2 and then to metal-3. Similarly, a diffusion region 1520 is coupled to VCCint. Polysilicon is used to form control electrode (i.e., a gate) 1365 of transistor 1355. Inverting amplifier 1360 will be coupled to the polysilicon.

Forming the transistor 1355 as shown in FIGS. 14 and 15 provides certain benefits including evenly distributing current and power throughout the integrated circuit. The IR (voltage) drop and turn-on resistance are minimized. This means there will be less chance for generating "hot spots" on the integrated circuit, where a portion of the integrated circuit is subject to abnormally high temperature compared to the rest of the integrated circuit. This is undesirable since the reliability of the integrated circuit may be reduced. Also, since the device is formed using metal fingers, the structure will act analogously to a big heat fin (e.g., heat sink), which draws heat away from the integrated circuit.

Figure 16:
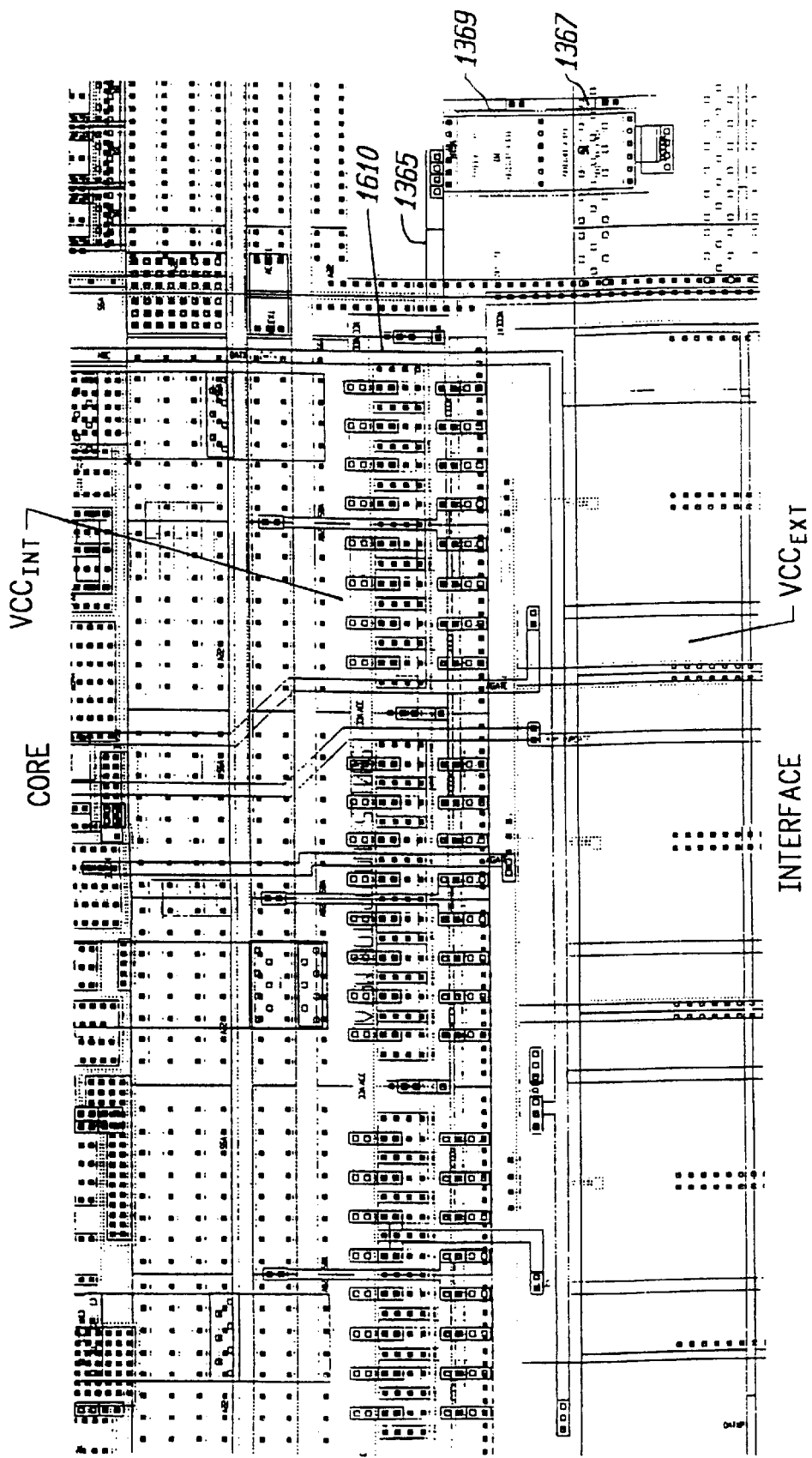
FIG. 16 shows a layout of a portion of the voltage down converter, including voltage clamping devices.

FIG. 16 shows a layout of a portion of transistor 1355. The specific connections between the geometries and layers are similar to those shown and described for FIG. 15. A plurality of transistor fingers 1610 is used to form this portion of transistor 1355. VCCint is coupled to one side of transistor 1355. VCCext is coupled to transistor 1355. Furthermore, transistors 1367 and 1369, used for voltage clamping, are shown coupling to electrode 1365.

The portion of the transistor 1355 shown in FIG. 16 may be repeated as many times as necessary, or as space permits. Note that transistors 1367 and 1369 may also be repeated for each grouping of transistor fingers. In this case, there would be multiple instances of transistors 1367 and 1369 throughout the integrated circuit. Since each occurrence of transistors 1367 and 1369 would be distributed around the integrated circuit, this improves the response time for these devices as the parasitics delays will be less.

Figure 17:
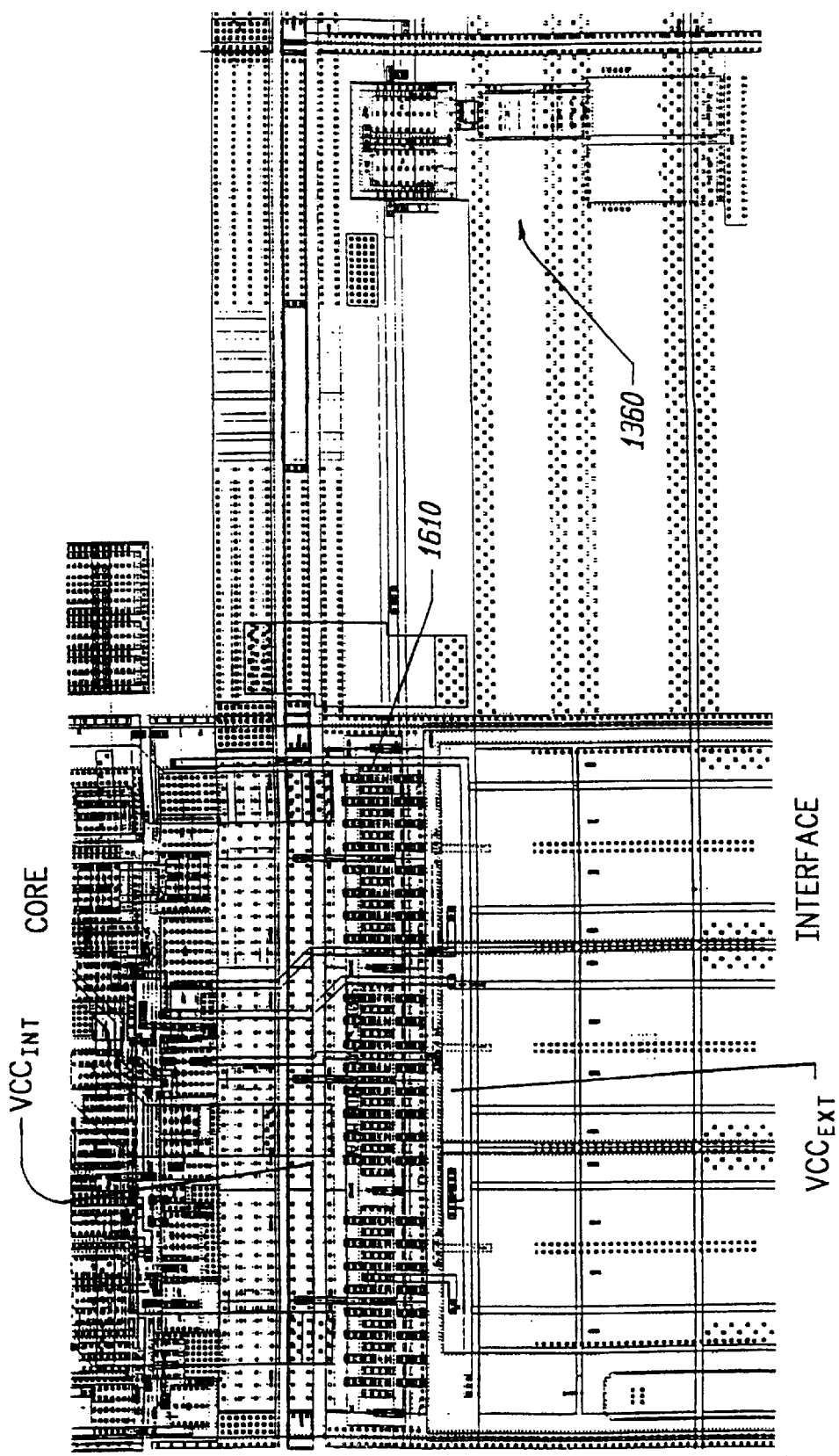
FIG. 17 shows a layout of a portion of the voltage down converters, including an inverting amplifier circuit.

FIG. 17 shows another layout of a portion of transistor 1355. FIG. 17 shows similar features as FIG. 16. However, inverting amplifier 1360 is shown coupled to electrode node 1365. This structure may be repeated many times in an integrated circuit to achieve the desired size for transistor 1355. Analogous to the discussion for FIG. 16, there may be multiple instances of inverting amplifier 1360 (coupled in parallel) distributed around the integrated circuit. This also improves the response time for the inverting amplifier since the parasitic delays are reduced.

Figure 18:
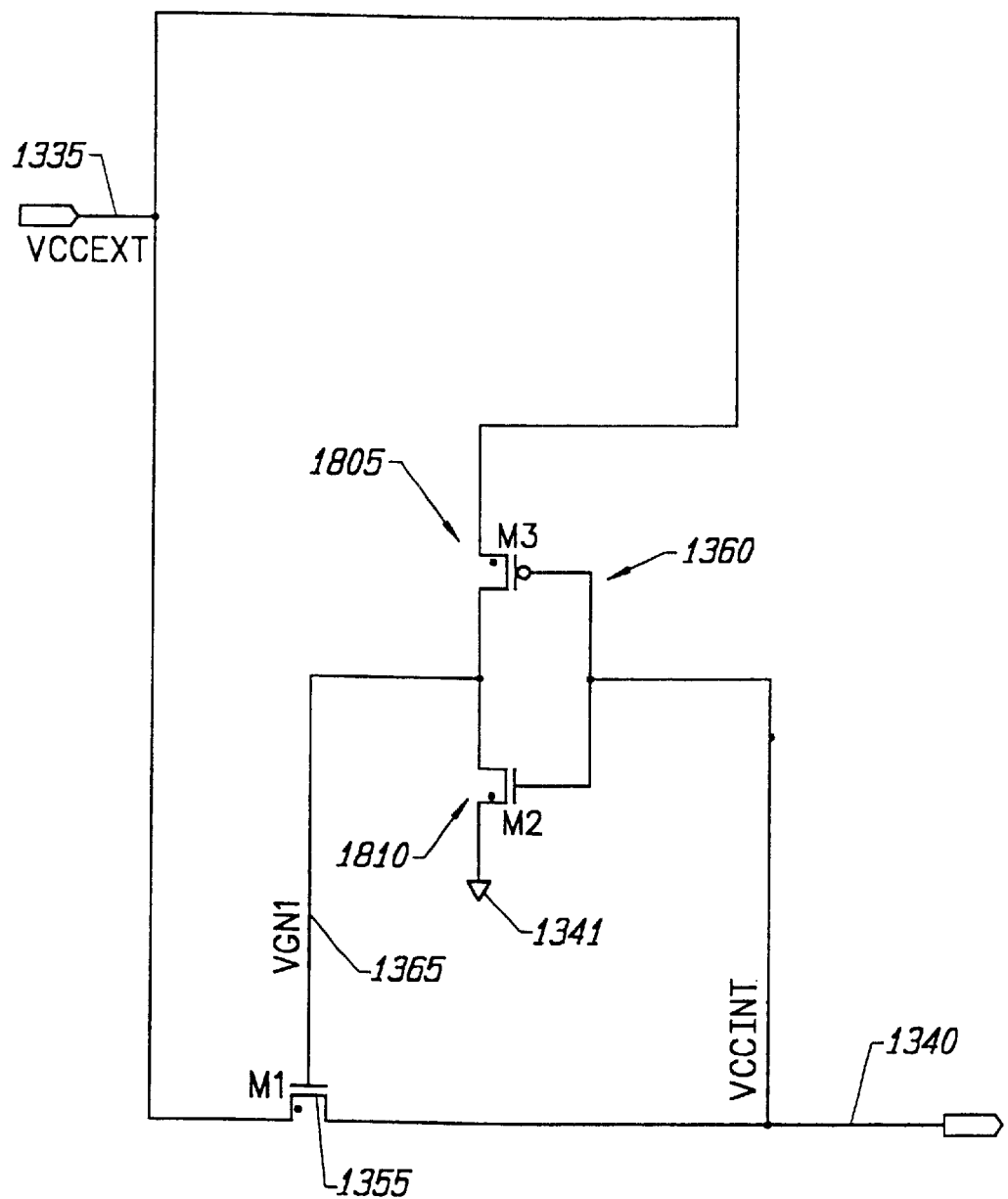
FIG. 18 shows a circuit diagram of a voltage down converter and a specific implementation of an inverting amplifier.

FIG. 18 is a schematic of an implementation of voltage down converter 1330. Inverting amplifier 1360 is formed using a first transistor 1805 and a second transistor 1810, which are coupled in series between VCCext 1335 and VSSQ 1341. An output of inverting amplifier 1360 is taken from between first transistor 1805 and second transistor 1810, and coupled to control electrode node 1365. A control electrode of first transistor 1805 is coupled to VCCint. Similarly, a control electrode of second transistor 1810 is coupled to VCCint.

In a preferred embodiment, first transistor 1805 is a PMOS transistor while transistor 1810 is an NMOS transistor. A layout of this embodiment of inverting amplifier 1360 is shown in FIG. 17 (pointed to by reference number 1360). Note in this implementation, clamping transistors 1367 and 1369 are not shown; however, these devices may be optionally included for the reasons discussed above.

Figure 19:
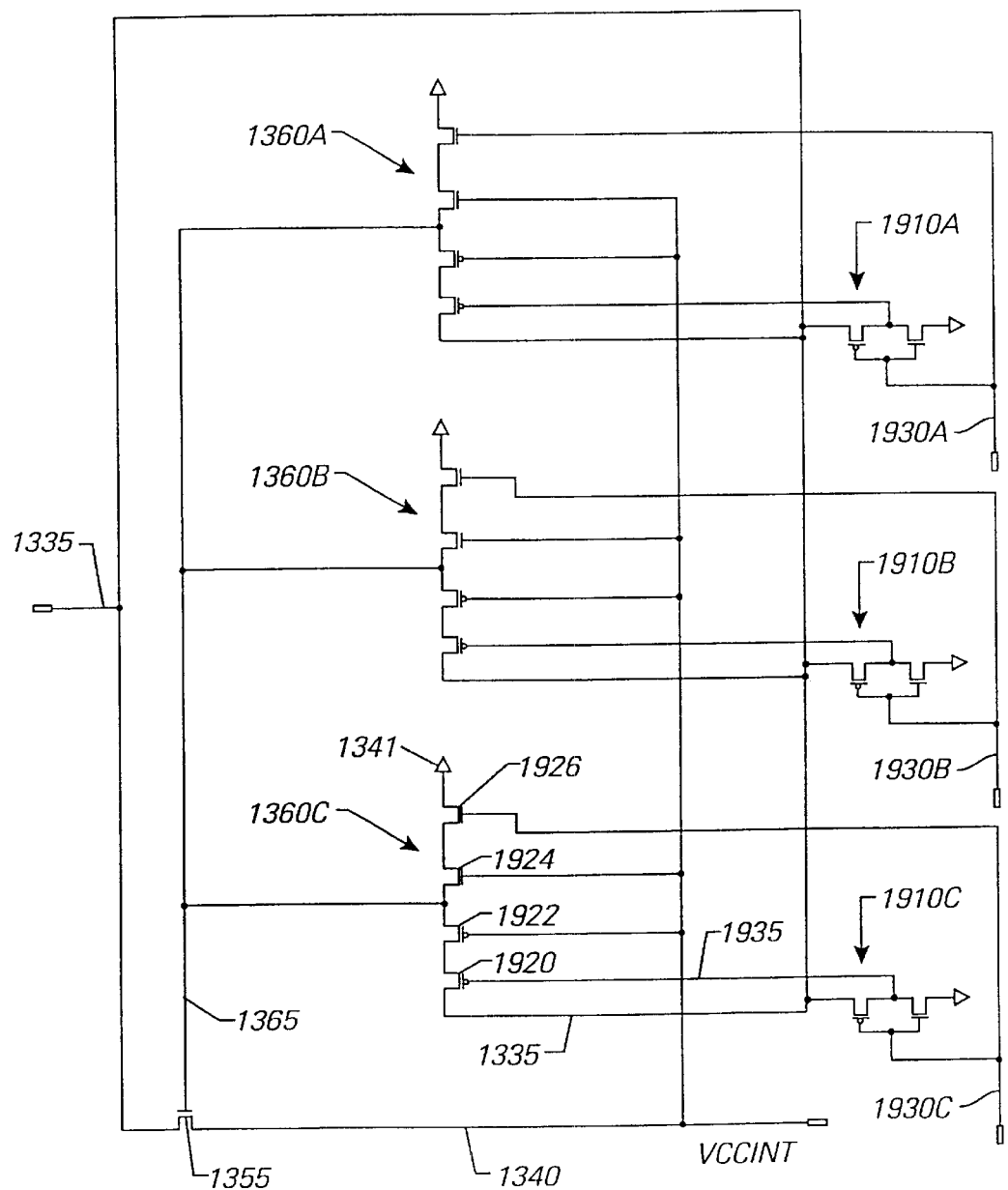
FIG. 19 shows a further embodiment of a voltage down converter where the inverting amplifier may be logically controlled.

FIG. 19 is a schematic of a further embodiment of the present invention. In this embodiment, there are a plurality of inverting amplifiers 1360A, 1360B, and 1360C. This schematic represents an implementation where individual amplifiers are distributed around the integrated circuit. Inverting amplifiers 1360A, 1360B, and 1360C use similar circuitry. Furthermore, inverting amplifiers 1360A, 1360B, and 1360C are controlled by signals at nodes 1930A, 1930B, and 1930C, respectively.

In this embodiment, an inverting amplifier 1360 (e.g., 1360C) has transistors 1920, 1922, 1924, and 1926 coupled in series between VCCext and VSSQ. An output of inverting amplifier 1360C is taken from between transistors 1922 and 1924, and coupled to control electrode node 1365. Control electrodes of transistor 1922 and 1924 are coupled to VCCint.

A control electrode of transistor 1926 is coupled to a first control signal at node 1930C. A control electrode of transistor 1920 is coupled to a second control signal 1935, which is a complement of the first control signal at node 1930C, generated by buffer 1910C. Specifically, in FIG. 19, buffer 1910C is a CMOS inverter which uses VCCext and VSSQ as its supplies.

In operation, inverting amplifier 1360C is turned on or off depending on first control signal at node 1930C and second control signal 1935. When first control signal at node 1930C is a logic high, second control signal 1935 is a logic low, inverting amplifier 1360C is enabled and operates similarly to inverting amplifier 1360 shown in FIG. 18. On the other hand, when first control signal 1930C is a logic low, second control signal 1935 is a logic high, inverter amplifier 1360C is disabled and effectively decoupled from electrode node 1365.

Inverting amplifiers 1360A and 1360B operate similarly as described for inverting amplifier 1360C. First control signal at node 1930C may be useful for controlling the amount of power dissipation in the integrated circuit since inverting buffers 1360A, 1360B, and 1360C may be selectively turned off.

Figure 20A:
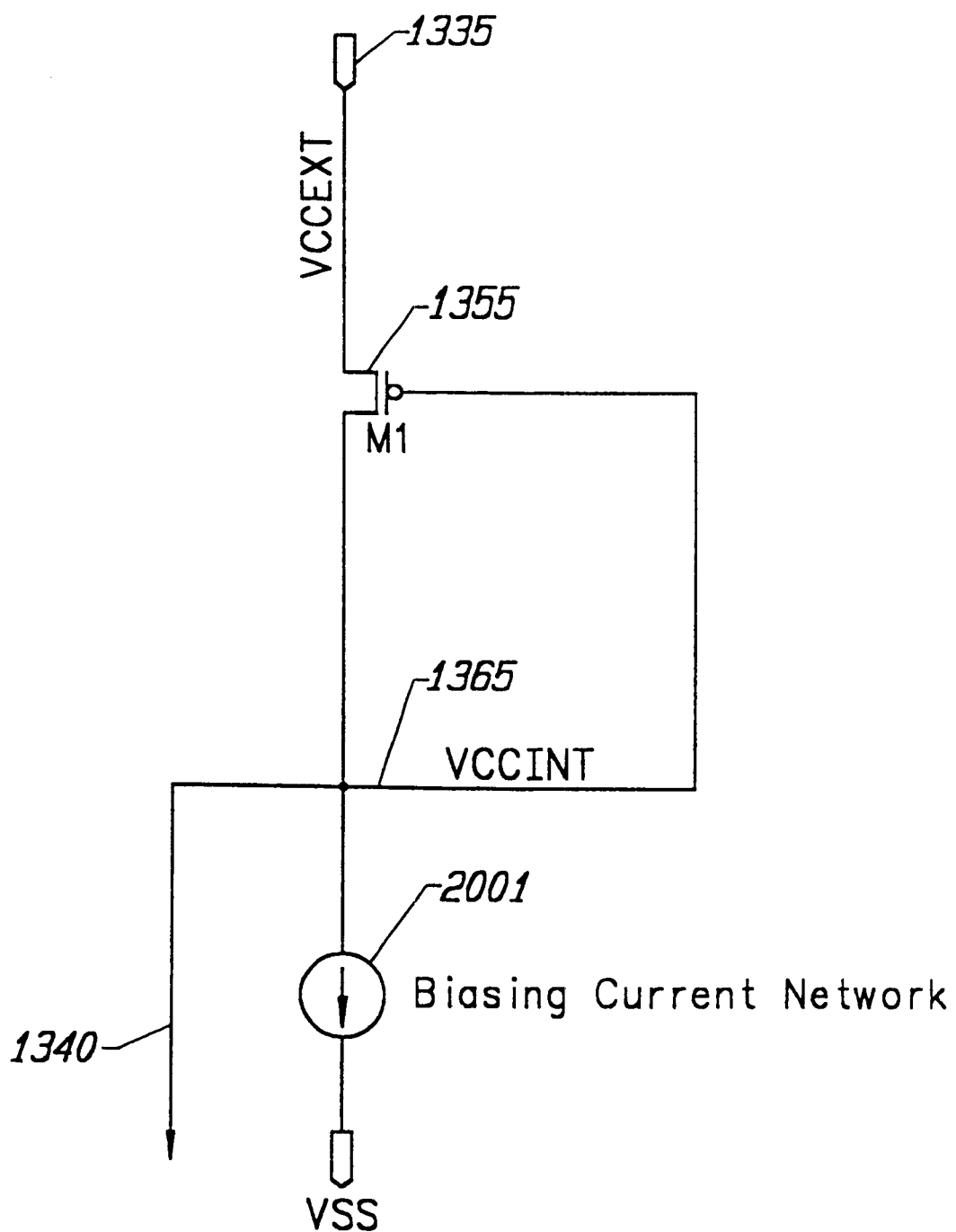
FIG. 20A shows a voltage down converter circuit using a biasing current network.

FIG. 20A shows a diagram of a further embodiment of a voltage down converter 1330 of the present invention. In this embodiment, transistor 1355 is coupled between VCCext 1335 and a first terminal of biasing current network 2001. In this embodiment, transistor 1355 is a PMOS transistor. A control electrode node 1365 of transistor 1355 is coupled to the first terminal of biasing current network 2001. The first terminal of biasing current network 2001 is coupled to and used for VCCint. Biasing current network 2001 contains circuitry to maintain a constant current through transistor 1355, which generates a stable voltage at VCCint. VCCint is coupled to the core of the integrated circuit at node 1340. Biasing current network 2001 ensures VCCint does not charge up to the voltage of VCCext 1335. There are many implementations for biasing current network 2001. For example, biasing current network 2001 may implemented using current mirrors, voltage regulators, operational amplifiers, or combinations of these, just to name a few.

Figure 20B:
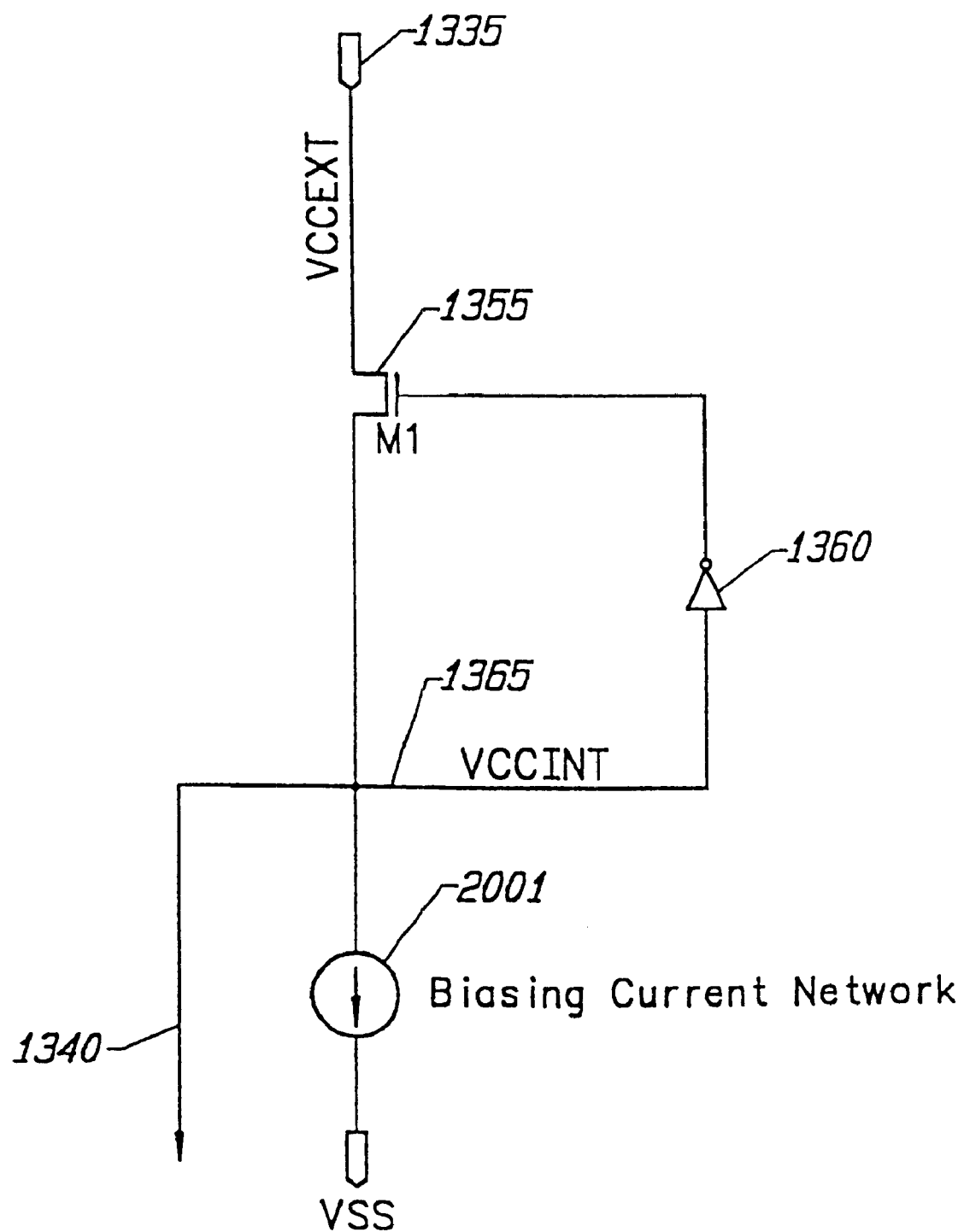
FIG. 20B shows an alternative embodiment of a voltage down converter circuit using a biasing current network.

FIG. 20B shows a diagram of another embodiment of the present invention. This embodiment is similar to the embodiments shown in FIGS. 13 and 20A. Transistor 1355 in this embodiment is a native device having a threshold voltage that is generally below that for an enhancement device. Similar to the embodiment in FIG. 13, a control electrode of transistor 1355 is coupled to an output of inverter 1360. Inverter 1360 is coupled to VCCint 1365. This embodiment also includes a biasing current network 2001. Biasing current network 2001 ensures VCCint does not charge up to the voltage of VCCext 1335, similar to the embodiment in FIG. 20A.

Figure 21:
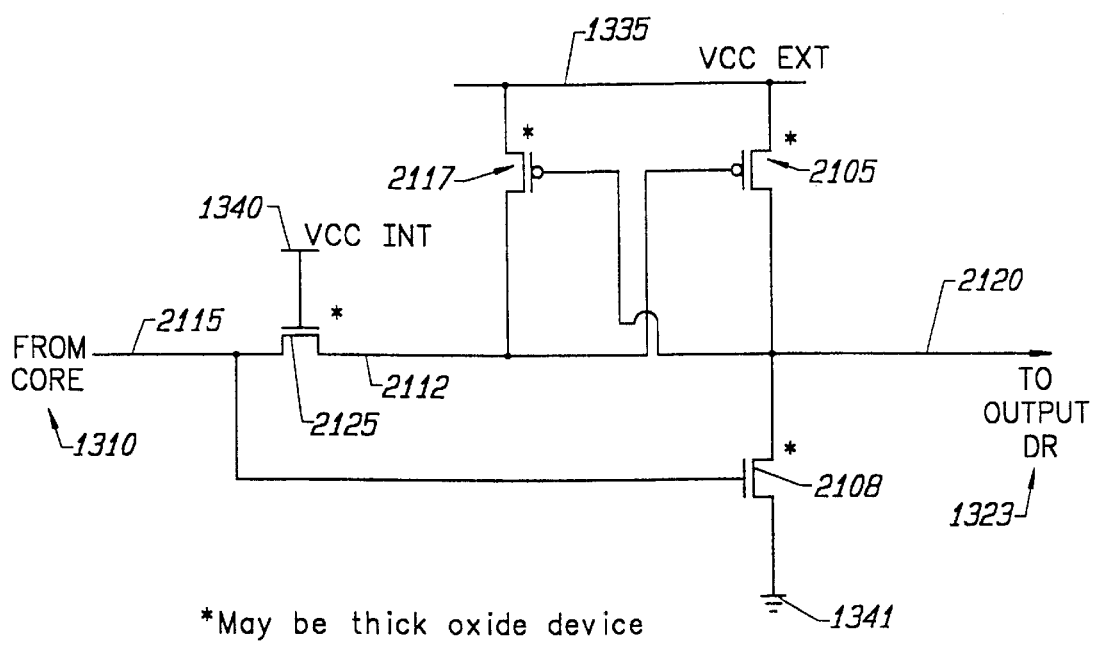
FIG. 21 shows a circuit diagram of a level shifter circuit.

FIG. 21 shows a schematic of level shifting circuit 1317. A transistor 2105 and a transistor 2108 are coupled in series between VCCext and VSSQ. A control electrode of transistor 2105 is coupled to a node 2112. A control electrode of transistor 2108 is coupled to a node 2115, which is coupled to core 1310. A transistor 2117 is coupled between VCCext and node 2112. A control electrode of transistor 2117 is coupled to an output of level shifting circuit 1317 at a node 2120, which is coupled to I/O driver 1323. A transistor 2115 is coupled between nodes 2115 and 2112. A control electrode of transistor 2125 is coupled to VCCint. In an alternative embodiment, this voltage may be VCCext if the core is able to operate with and tolerate a voltage of about VCCext−VTN. In a preferred embodiment, transistors 2105 and 2117 are PMOS transistors, and transistors 2108 and 2125 are NMOS transistors.

In operation, a logic low input at node 2115 will result in a logic high output at node 2120. The voltage level for this logic high output at node 2120 will be VCCext, passed through transistor 2105. Transistors 2108 and 2117 will be off. Moreover, for transistor 2117, VCCext at output node 2120 feeds back to turn transistor 2117 off completely.

A logic high input at node 2115 will result in a logic low output at node 2120. Specifically, the voltage level for this logic low output at node 2120 will be VSSQ, passed through transistor 2108. VSSQ from node 2120 will turn transistor 2117 fully on so that node 2112 will be at VCCext. VCCext at node 2112 will turn transistor 2105 fully off. Also, VCCext is isolated from node 2115 since the maximum voltage that can be passed through transistor 2125 to node 2115 is about VCCint−VTN.

The circuitry in FIG. 21 is an example of a specific implementation of a level shifting circuit. Other circuit embodiments may also be used.

In a specific embodiment, transistors 2105, 2108, 2117, and 2125 may be thick oxide devices (individually and in combination with another) in order to ensure oxide reliability. One situation where the oxide is stressed is when VCCext and VCCint are powered up at different times. In that case, VCCint may be about ground while VCCext is about 5 volts. When node 2120 is about ground, node 2112 will be at about 5 volts.

Figure 22:
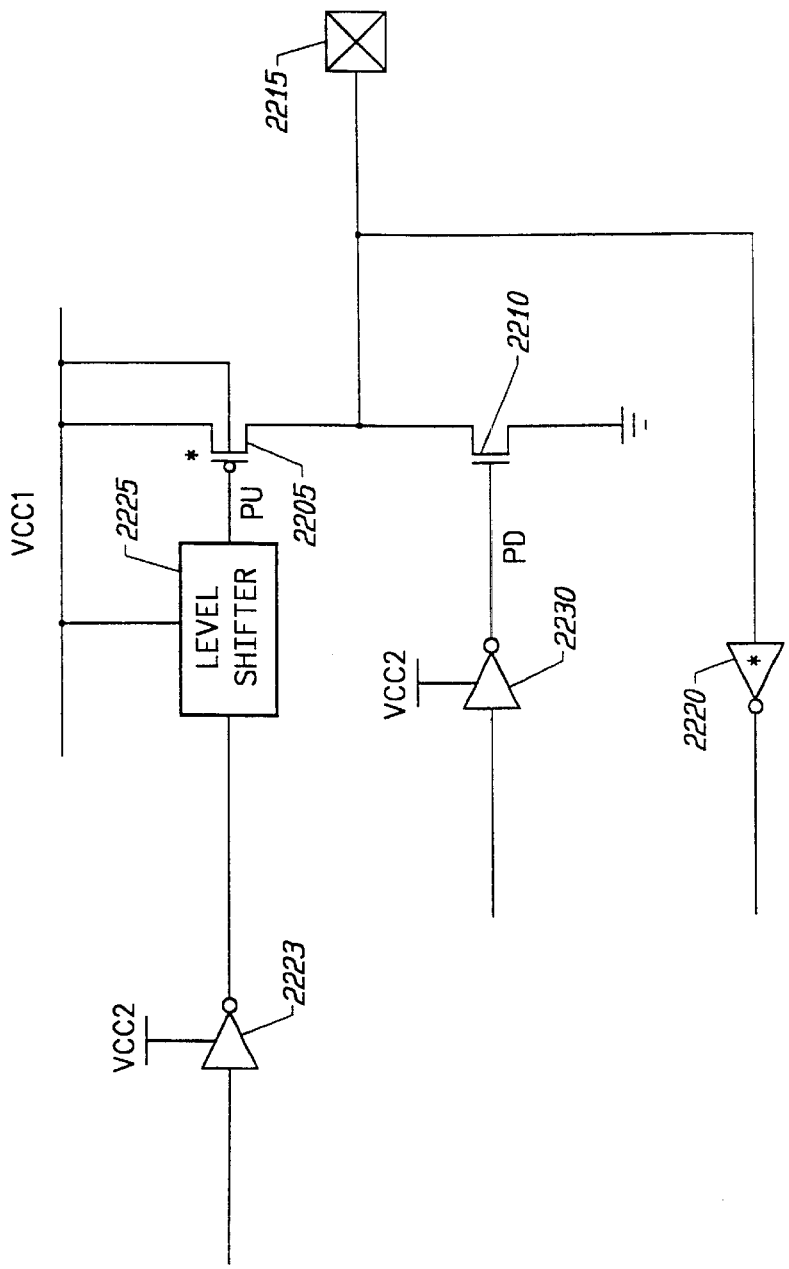
FIG. 22 shows a schematic of a circuitry for interfacing low voltage internal circuitry with higher voltage external circuitry.

FIG. 22 shows a diagram of a circuit implementation for interfacing low voltage internal circuitry with higher voltage external circuitry. This circuitry may be used within an option (such as shown in FIGS. 6 and 13) where the integrated circuit provides a high-level output voltage higher than a supply voltage for the internal circuitry. This circuitry may also be used in other options.

The circuitry may be used as an input/output buffer for an integrated circuit. The circuitry is coupled to a VCC1 supply voltage and a VCC2 supply voltage. VCC1 is at a voltage level above VCC2. For example, VCC1 may be about 3.3 volts while VCC2 may be about 2.5 volts. VCC2 is coupled to the internal circuitry of the integrated circuit. VCC2 may be internally generated, such as by using an on-chip voltage down converter as shown in FIG. 13, or may be provided through an external pin. The VCC2 voltage may be provided externally from an off-chip voltage regulator or converter, or other voltage generating means (e.g., power supply, transformer, and others). VCC1 is at the voltage level for external interfacing. For example, when VCC1 is 3.3 volts, the integrated circuit will be able to generate external voltages of about 3.3 volts.

The circuitry includes a pull-up driver 2205 coupled in series with a pull-down driver 2210, between VCC1 and VSS. A node between pull-up driver 2205 and pull-down driver 2210 is coupled to a pad 2215 for interfacing to external circuitry. Pad 2215 may also be coupled to an input buffer 2220 for inputting signals into the integrated circuit. Signals from the output drivers may also be fed back through input buffer 2220 into the chip. In a preferred embodiment, pull-up device 2205 is a PMOS transistor, which has a body electrode coupled to VCC1. In a case where a voltage level at a pad 2115 may exceed VCC1, a floating well may be needed for pull-up device 2205. A specific floating well implementation was previously discussed (e.g., see FIG. 10). Pull-down device 2210 is a NMOS transistor.

The output driver circuitry in FIG. 22 operates analogously to the output driver circuitry shown in FIG. 8. A control electrode of pull-up driver 2205 is coupled to a PU signal. The PU signal is generated from a signal from internal circuitry, such as buffer 2223, which is coupled to VCC2. This signal output from buffer 2223 is coupled through level shifter 2225 to PU. Level shifter 2225 is coupled to VCC1 and performs the same function as the level shifter 1317 of FIG. 13. Specifically, level shifter 2225 will shift the voltage output level from buffer 2223 to one which is compatible with the VCC1 supply voltage.

A buffer 2230 is coupled to PD which is coupled to the control electrode of pull-down device 2210. Buffer 2230 is coupled to the VCC2 supply voltage.

By appropriately controlling the voltages at PU and PD, the output circuitry will produce logical output at pad 2215 in the voltage range between VCC1 and VSS. The output at pad 2215 may also be tristate.

To turn on pull-up device 2205, level shifter 2225 will, couple VSS to PU. To turn off pull-up device 2205, level shifter 2225 will couple VCC1 to pull-up device 2205. When VCC1 is coupled to the control electrode of pull-up device 2205, there will not be sneak current or leakage path for similar reasons as discussed above in connection with FIG. 9A.

Pull-up driver 2205 and the devices used to implement input buffer 2220 may be thick oxide devices in order to ensure oxide reliability, as discussed above for the implementation shown in FIG. 21. One situation, among others, where this may be necessary is to address the situation when VCC1 (external supply) and VCC2 (internal supply) are powered up at different times as discussed above.

Figures 23, 24:
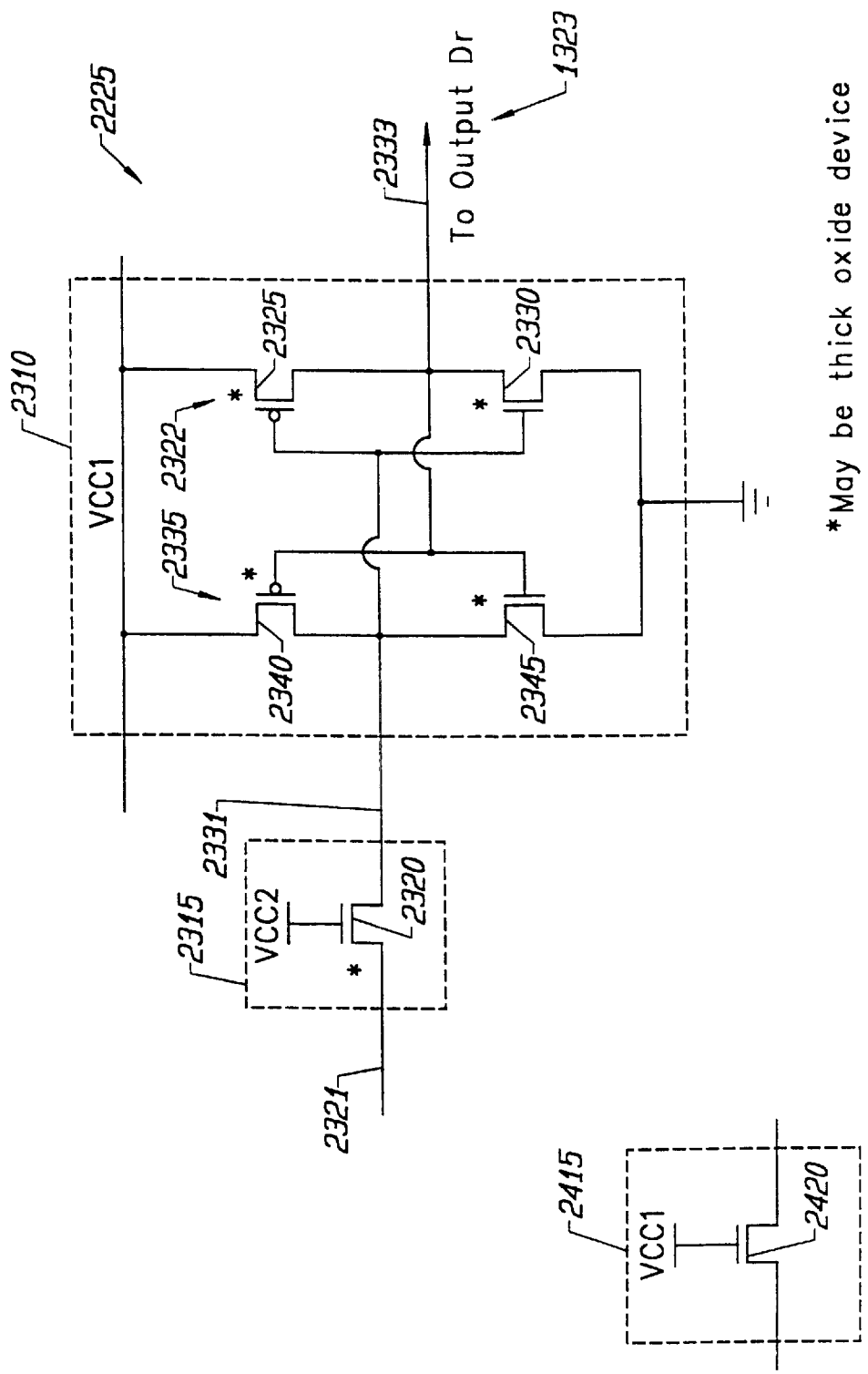
FIG. 23 shows a specific embodiment of a level shifter circuit.
FIG. 24 shows an embodiment of an isolation device.

There are many techniques for implementing a level shifter. For example, a particular embodiment is shown in FIG. 21. FIG. 23 shows another implementation of a level shifter. In a preferred embodiment, this level shifter is on the same integrated circuit as the core of the integrated circuit. This will make more economical use of the printed circuit board area. However, an off-chip level shifter may also be used in particular embodiments. For example, by using an on-chip level shifter, a particular integrated circuit may interface with both low voltage and high voltage integrated circuits at the same time.

The circuit configuration in FIG. 23 is a cross-coupled latch 2310 and an isolation device 2315. In one embodiment, isolation device 2315 is an NMOS transistor 2320 having a control electrode coupled to VCC2. A first terminal of isolation device 2315 is an input 2321 for the level shifter.

Cross-coupled switch 2310 has a first buffer 2322 which includes a first pull-up device 2325 and a first pull-down device 2330, coupled in series between VCC1 and VSS. An input of first buffer 2322 is coupled to a second terminal 2331 of isolation device 2315. An output 2333 of first buffer 2322 is also an output of the level shifter. This output will typically produce output in the range from VSS to VCC1.

A second buffer 2335 for cross-coupled switch 2310 includes a second pull-up device 2340 and a second pull-down device 2345, coupled in series between VCC1 and VSS. An output of second buffer 2335 is coupled to an input of first buffer 2322. Similarly, output 2333 is coupled to an input of second buffer 2335.

In a preferred embodiment, the pull-up devices 2325 and 2335 are PMOS devices while the pull-down devices 2340 and 2345 are NMOS devices. The PMOS devices may have a floating well as similarly as described for the PMOS devices in FIG. 10A. Alternatively, the PMOS devices may have a substrate or well connection to VCC1

The operation of the level shifter in FIG. 23 is similar to that described for the circuitry in FIG. 21. Input 2321 will be in a range from VSS to about VCC2. When input 2321 is a low, first buffer 2322 will output a logic high which will be at about VCC1 at output 2333. Second buffer 2335 will output a logic low of about zero volts. A control electrode of second pull-up device 2335 will be at VCC1, which will turn that device off completely.

When input 2321 is a logic high (e.g., about VCC1), first buffer 2322 will output a logic low will be at about VSS at output 2333. Second buffer 2335 will output a logic high of about VCC1. Consequently, VCC1 will be coupled to a control electrode of first pull-up device 2325, which will turn that device off completely.

Isolation device 2315 prevents a voltage above VCC2–VTN from passing to node 2321. This prevents high voltages from possibly damaging core circuitry coupled at node 2321.

FIG. 24 shows a isolation device 2415 which may be substituted for isolation device 2315. An NMOS device 2420 is a thick oxide device with a VTthick. VTthick may be about 1 volt or above. A control electrode of NMOS device 2420 is coupled to VCC1. With this isolation circuitry, the voltage at node 2321 will be at most VCC1–VTthick, which should still be relatively safe for interfacing with the low-voltage core circuitry. Further, since device 2420 is a thick device, it will be able to tolerate the VCC1 voltage at its control electrode. Whether isolation device 2315 or 2415 is used depends on many factors including the provision of the various devices by the process technology.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. An integrated circuit comprising:
   a first metal-3 layer bus to carry an internal VCC supply for circuitry in a core portion of the integrated circuit;
   a second metal-3 layer bus to carry an external VCC supply, wherein the second metal-3 bus runs parallel to the first metal-3 bus;
   a diffusion region between the first and second metal-3 layer buses; and
   a plurality of polysilicon gate regions distributed surrounding the core portion of the integrated circuit to separate the diffusion regions into a plurality of first and second diffusion region portions, wherein the first diffusion region portions are source terminals for a conversion transistor and are coupled to the second metal-3 layer bus using a first plurality of metal-1 and metal-2 layer interconnects, the second diffusion region portions are drain terminals for the conversion transistor and are coupled to the first metal-3 layer bus using a second plurality of metal-1 and metal-2 layer interconnects, and the polysilicon gate regions are coupled together to be a gate terminal of the conversion transistor.

2. The integrated circuit of claim 1 wherein the first plurality of metal-1 and metal-2 layer interconnects are perpendicular to the second metal-3 layer bus.

3. The integrated circuit of claim 1 wherein the second plurality of metal-2 1 and metal-2 layer interconnects are perpendicular to the first metal-3 layer bus.

4. The integrated circuit of claim 1 wherein the conversion transistor has a gate width of greater than 3000 microns.

5. The integrated circuit of claim 1 wherein the metal-3 layer is above the metal-2 layer and the metal-2 layer is above the metal-1 layer.

6. The integrated circuit of claim 1 wherein the first metal-3 layer bus provides a lower voltage level than the second metal-3 layer bus.

7. The integrated circuit of claim 1 further comprising:
a voltage clamp circuit coupled between the second metal-3 layer bus and the gate terminal of the conversion transistor.

8. The integrated circuit of claim 1 further comprising:
a plurality of amplifier circuits, each having an input coupled to the first metal-3 layer bus and an output coupled to the gate terminal of the conversion transistor.

9. The integrated circuit of claim 8 wherein the plurality of amplifier circuits are distributed surrounding the core portion of the integrated circuit and coupled to the plurality of polysilicon gate regions.

10. The integrated circuit of claim 1 wherein the integrated circuit is a programmable logic integrated circuit.

11. An integrated circuit comprising:
an inner metal conductor on a semiconductor substrate;
an outer metal conductor on the semiconductor substrate, parallel to the inner metal conductor;
a conversion transistor between the inner and outer metal conductors;
a first plurality of metal conductors, perpendicular to the inner and outer conductors, coupling the inner metal conductor to drain terminals of the conversion transistor; and
a second plurality of metal conductors, perpendicular to the inner and outer conductors, coupling the outer metal conductors to source terminals of the conversion transistor, wherein the inner metal conductor forms an inner metal ring of the integrated circuit and the outer metal conductor forms an outer metal ring of the integrated circuit.

12. The integrated circuit of claim 11 wherein the first and second plurality of metal conductors dissipate heat generated by current flowing through the conversion transistor from the outer metal conductor to the inner metal conductor.

13. The integrated circuit of claim 11 wherein the first plurality of metal conductors and second plurality of metal conductors extend along the inner and outer metal conductors.

14. The integrated circuit of claim 11 wherein the integrated circuit is a programmable logic integrated circuit.

15. An integrated circuit comprising:
an inner metal conductor on a semiconductor substrate, wherein the inner metal conductor is parallel to an edge of the integrated circuit;
an outer metal conductor on the semiconductor substrate, parallel to the edge of the integrated circuit and inner metal conductor, wherein the outer metal conductor is positioned closer to the edge of the integrated circuit than the inner metal conductor;
a plurality of transistors formed in an area of the semiconductor substrate adjacent the inner metal conductor, away from the edge of the integrated circuit and the outer conductor, wherein the plurality of transistors is coupled to receive power from the inner metal conductor;
a conversion transistor formed in an area of the semiconductor substrate between the inner and outer metal conductors;
a first plurality of metal conductors, perpendicular to the inner and outer conductors, coupling the inner metal conductor to drain terminals of the conversion transistor; and
a second plurality of metal conductors, perpendicular to the inner and outer conductors, coupling the outer metal conductors to source terminals of the conversion transistor.

16. The integrated circuit of claim 15 wherein the first and second plurality of metal conductors dissipate heat generated by current flowing through the conversion transistor from the outer metal conductor to inner metal conductor.

17. The integrated circuit of claim 15 wherein the inner metal conductor forms an inner metal ring of the integrated circuit and the outer metal conductor forms an outer metal ring of the integrated circuit.

18. The integrated circuit of claim 15 wherein the conversion transistor is an n-channel transistor.

19. The integrated circuit of claim 15 wherein the conversion transistor is an n-channel transistor, and
the outer conductor is coupled to a voltage above ground.

20. The integrated circuit of claim 15 wherein the outer conductor is coupled to a voltage above ground.

21. The integrated circuit of claim 15 wherein the outer conductor is coupled to a positive voltage from external to the integrated circuit.

22. The integrated circuit of claim 15 wherein the outer conductor is coupled to a VCC voltage to the integrated circuit.

23. The integrated circuit of claim 15 wherein the outer conductor is coupled to a VCC voltage to the integrated circuit, and
the inner conductor is provides a voltage below the VCC voltage to the plurality of transistors formed in an area of the semiconductor substrate adjacent the inner metal conductor.

24. The integrated circuit of claim 15 wherein the integrated circuit is a programmable logic integrated circuit.

25. An integrated circuit comprising:
an inner metal conductor on a semiconductor substrate, wherein the inner metal conductor is parallel to an edge of the integrated circuit;
an outer metal conductor on the semiconductor substrate, parallel to the edge of the integrated circuit and inner metal conductor, wherein the outer metal conductor is positioned closer to the edge of the integrated circuit than the inner metal conductor;

a plurality of transistors formed in an area of the semiconductor substrate adjacent the inner metal conductor, away from the edge of the integrated circuit and the outer conductor, wherein the plurality of transistors is coupled to receive power from the inner metal conductor; and a conversion transistor formed in an area of the semiconductor substrate between the inner and outer metal conductors, coupled to the inner and outer metal conductors.

26. The integrated circuit of claim 25 further comprising:

a first plurality of metal conductors, perpendicular to the inner and outer conductors, coupling the inner metal conductor to drain teals of the conversion transistor; and a second plurality of metal conductors, perpendicular to the inner and outer conductors, coupling the outer metal conductors to source terminals of the conversion transistor.

27. The integrated circuit of claim 25 wherein the inner metal conductor forms an inner metal ring of the integrated circuit and the outer metal conductor forms an outer metal ring of the integrated circuit.

28. The integrated circuit of claim 25 wherein the conversion transistor is an n-channel transistor, and the outer conductor is coupled to a voltage above ground.

29. The integrated circuit of claim 25 wherein the outer conductor is coupled to a VCC voltage to the integrated circuit, and the inner conductor is provides a voltage below the VCC voltage to a plurality of transistors formed in an area of the semiconductor substrate adjacent the inner metal conductor.

30. The integrated circuit of claim 25 wherein the integrated circuit is a programmable logic integrated circuit.

31. An integrated circuit comprising:

an inner metal conductor on a semiconductor substrate;

an outer metal conductor on the semiconductor substrate, wherein the outer metal conductor is parallel to the inner metal conductor and is coupled to a positive supply voltage, above a ground level, for the integrated circuit;

an n-channel conversion transistor between the inner and outer metal conductors;

a first plurality of metal conductors, perpendicular to the inner and outer conductors, coupling the inner metal conductor to drain terminals of the conversion transistor; and a second plurality of metal conductors, perpendicular to the inner and outer conductors, coupling the outer metal conductors to source terminals of the conversion transistor.

32. The integrated circuit of claim 31 wherein the positive supply voltage is supplied from an external source to the integrated circuit.

33. The integrated circuit of claim 31 wherein the outer conductor is coupled to a VCC voltage to the integrated circuit, and the inner conductor is provides a voltage below the VCC voltage to a plurality of transistors formed in an area of the semiconductor substrate adjacent the inner metal conductor.

34. The integrated circuit of claim 31 wherein the integrated circuit is a programmable logic integrated circuit.

* * * * *

UNITED STATES PATENT AND TRADEMARK OFFICE
CERTIFICATE OF CORRECTION

PATENT NO.     : 6,414,518 B1
DATED          : July 2, 2002
INVENTOR(S)    : Patel et al.

It is certified that error appears in the above-identified patent and that said Letters Patent is hereby corrected as shown below:

Title page,
Item [54], please correct the title to read -- STRUCTURE FOR INTEGRATED CIRCUIT TO PROVIDE AN ON-CHIP VOLTAGE --.

Column 29,
Line 14, please replace "teals" with -- terminals --.

Signed and Sealed this

Twenty-fifth Day of February, 2003

JAMES E. ROGAN
*Director of the United States Patent and Trademark Office*